United States Patent
Okamoto et al.

(10) Patent No.: US 6,512,715 B2
(45) Date of Patent: Jan. 28, 2003

(54) SEMICONDUCTOR MEMORY DEVICE OPERATING WITH LOW POWER CONSUMPTION

(75) Inventors: Takeo Okamoto, Hyogo (JP); Tadaaki Yamauchi, Hyogo (JP); Junko Matsumoto, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/987,837

(22) Filed: Nov. 16, 2001

(65) Prior Publication Data

US 2002/0191472 A1 Dec. 19, 2002

(30) Foreign Application Priority Data

Jun. 15, 2001 (JP) .................................... 2001-181403

(51) Int. Cl.[7] .................................... G11C 7/00
(52) U.S. Cl. .................. 365/227; 365/226; 365/189.09
(58) Field of Search .......................... 365/227, 226, 365/189.09, 230.06, 189.05, 189.07, 189.11

(56) References Cited

U.S. PATENT DOCUMENTS 6,067,269 A * 5/2000 Han et al. .................. 327/530

* cited by examiner

*Primary Examiner*—David Lam
(74) *Attorney, Agent, or Firm*—McDermott, Will & Emery

(57) ABSTRACT

In a low power consumption mode, an internal power supply circuit produces an internal power supply voltage by electrically coupling an internal power supply line to either an external power supply line or a ground line through a transistor. Accordingly, in the low power consumption mode, supply of an operating current to a reference voltage generation circuit, a buffer circuit, an internal power supply voltage generation circuit and a voltage booster circuit is discontinued, allowing for reduction in power consumption of the internal power supply circuit itself.

18 Claims, 16 Drawing Sheets

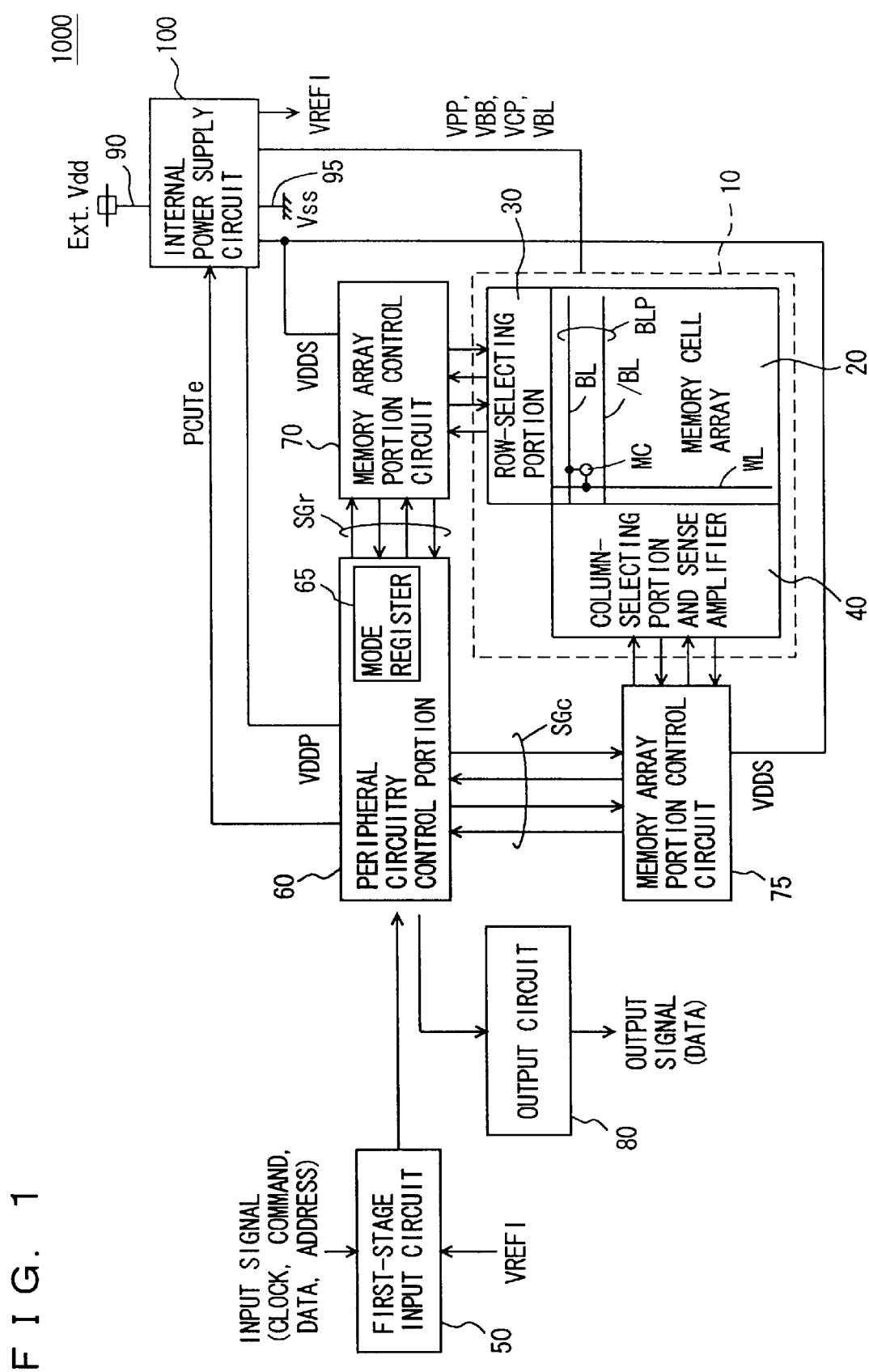
F I G. 1

| POWER SUPPLY | NORMAL MODE | DEEP POWER-DOWN MODE |
|---|---|---|
| VDDP | Ext. Vdd (2.5V LEVEL) | Ext. Vdd |
|  | 2.5V (2.7V LEVEL) | Ext. Vdd−Vtn |
| VDDS | 2.0V | Ext. Vdd−Vtn |
| VBL, VCP | 1.0V | OPEN |
| VBB | −1.0V | 0V (Vss) |
| VPP | 3.7V | Ext. Vdd (OR Ext. Vdd−Vtn) |

| BA1 | BA0 | A11 | A10 | A9 | A8 | A7 | A6 | A5 | A4 | A3 | A2 | A1 | A0 |
|---|---|---|---|---|---|---|---|---|---|---|---|---|---|
| 0 | 0 | 0 | 0 | WM | 0 | 0 | LTMODE | | | BT | BL | | |

USED FOR DEEP POWER-DOWN MODE ENTRY

F I G. 1 3

| POWER SUPPLY VOLTAGES | 2.5V-LEVEL Ext.Vdd | 2.7V-LEVEL Ext.Vdd | DIFFERENCE DEPENDING ON Ext.Vdd LEVEL |
|---|---|---|---|
| VDDS | 2.0V | 2.0V | IN 2.5 V LEVEL, RESPONSE SPEED OF COMPARATOR AND DRIVER IS INCREASED. |
| VDDP | Ext.Vdd | 2.5V | IN 2.5 V LEVEL, Ext.Vdd AND VDDP LINE ARE DIRECTLY COUPLED TOGETHER USING DRIVER, AND DRIVER SIZE IS AT LEAST DOUBLED. |
| VPP | 3.7V | 3.7V | IN 2.5 V LEVEL, PUMP CAPACITOR SIZE IS INCREASED. GATE IS BOOSTED IN TWO STAGES BOTH IN STANDBY AND ACTIVE PERIODS. |
| VBB | -1V | -1V | SAME |

SEMICONDUCTOR MEMORY DEVICE OPERATING WITH LOW POWER CONSUMPTION

BACKGROUND OF THE INVENTION

1. Field of the Invention

The present invention generally relates to a semiconductor memory device. More particularly, the present invention relates to a semiconductor memory device capable of operating with low power consumption.

2. Description of the Background Art

In recent years, semiconductor memory devices capable of being driven with low power consumption have been demanded for use in applications such as battery-powered portable equipments. In response to such a demand, the semiconductor memory devices have a low power consumption mode (power down mode) in addition to the normal mode in which normal operations such as data read operation and data write operation are required. In the low power consumption mode, most of the internal circuitry is rendered in a standby state in order to reduce the power consumption. Thus, according to an external operation request, the operation mode is switched between the normal mode and the low power consumption mode, whereby the power consumption of the semiconductor memory devices is reduced.

Since operation with a reduced voltage is effective for reduced power consumption, an external power supply voltage level has been increasingly reduced. For example, a 3.3 V-level (3.0 V to 3.6 V) external power supply voltage is used in the conventional general-purpose systems. However, a 2.7 V-level (2.7 V to 3.0 V) or 2.5 V-level (2.3 V to 2.7 V) external power supply voltage has been increasingly used in the systems operating a reduced voltage.

With reduction in power consumption, the power consumption ratio of the internal power supply circuit for generating internal power supply voltages to the entire semiconductor memory device is increased. Moreover, operation with a reduced voltage degrades the power efficiency of the internal power supply circuit. Accordingly, there is a need for a more powerful low power consumption mode in which the internal circuitry receiving the internal power supply voltages is rendered in a standby state in order to reduce not only the overall power consumption but also the power consumption of the internal power supply circuit itself.

In such a low power consumption mode as well, it is desirable that the mode entry can be implemented using an existing control system, i.e., without using a special entry method. Smooth transition to the low power consumption mode and smooth restoration to the normal mode are also desired.

As described above, various levels of external power supply voltages are currently used. In order to design the generalized semiconductor memory devices, the semiconductor memory device must be adaptable to different levels of external power supply voltages. For example, the internal power supply circuit is required to have the ability to maintain uniform control response of the internal power supply voltages even when a different level of external power supply voltage is applied.

Depending on the interface specification, the system incorporating the semiconductor memory device must be adapted to a 1.8 V-level I/O (Input/Output) signal of TTL (Transistor-Transistor Logic) level. Therefore, it is desirable that the signal input circuitry also be capable of receiving different I/O signal levels.

In the case where an operating condition to be applied is fixed in terms of the hardware by mask switching or the like in a generalized semiconductor memory device adaptable to various operating conditions (e.g., external power supply level and I/O signal level), the structure is also required that is capable of easily sensing the fixed operating condition from the outside of the semiconductor memory device.

SUMMARY OF THE INVENTION

It is an object of the invention to provide a semiconductor memory device capable of operating with low power consumption.

It is another object of the invention to provide a semiconductor memory device capable of operating with various levels of external power supply voltages and I/O signals.

It is a further object of the invention to provide, in a semiconductor memory device designed to be adaptable to various operating conditions, a structure capable of easily sensing an applied operating condition from the outside.

In summary, according to one aspect of the invention, a semiconductor memory device having a normal mode and a low power consumption mode includes: an internal circuit for conducting a data read operation, a data write operation and a data hold operation; a first external power supply line receiving a first external power supply voltage; a second external power supply line receiving a second external power supply voltage that is lower than the first external power supply voltage; an internal power supply line for transmitting an internal power supply voltage to the internal circuit; and an internal power supply circuit for receiving the first and second external power supply voltages and producing the internal power supply voltage. The internal power supply circuit includes a reference voltage generation portion for receiving the first and second external power supply voltages and generating a reference voltage corresponding to a target level of the internal power supply voltage, a first current shut-off switch for shutting off an operating current of the reference voltage generation portion in the low power consumption mode, an internal power supply voltage generation portion for keeping the internal power supply voltage at the target level according to comparison between the internal power supply voltage and the reference voltage in the normal mode, and discontinuing its operation in the low power consumption mode, and a connection switch for electrically coupling one of the first and second external power supply lines to the internal power supply line in the low power consumption mode.

Preferably, the connection switch includes an N-channel field effect transistor electrically coupled between the first external power supply line and the internal power supply line, and the first external power supply voltage is applied to a gate of the N-channel field effect transistor in the low power consumption mode.

Preferably, the connection switch includes a P-channel field effect transistor electrically coupled between the second external power supply line and the internal power supply line, and the second external power supply voltage is applied to a gate of the P-channel field effect transistor in the low power consumption mode.

In the low power consumption mode, such a semiconductor memory device can produce the internal power supply voltage without operating the reference voltage generation portion and the internal power supply voltage generation portion, allowing for reduction in power consumption of the internal power supply circuit itself.

Preferably, the semiconductor memory device further includes a mode register for retaining a mode setting that is externally applied with a first command. The mode setting includes designation of whether transition from the normal mode to the low power consumption mode is conducted or not. When the transition is designated in the mode setting, the low power consumption mode is started in response to a second command.

Thus, whether the transition to the low power consumption mode can be conducted or not can be selectively set based on the mode setting by a general mode register.

In particular, the second command is a special command for starting the low power consumption mode.

In particular, the internal circuit includes a plurality of memory cells arranged in a matrix, a plurality of word lines provided respectively corresponding to memory cell rows and being selectively activated, and a plurality of bit lines provided respectively corresponding to memory cell columns and being respectively coupled to the memory cells corresponding to an activated word line. The second command is a refresh command for conducting the data hold operation. After the refresh command is started, the low power consumption mode is started with each of the word lines being inactivated. Thus, transition from the normal mode to the low power consumption mode can be conducted in a period other than the period during which the internal circuit is unstable.

In particular, the semiconductor memory device further includes a control circuit for instructing restoration to the normal mode according to change of an external control signal from a first level to a second level in the low power consumption mode, the external control signal being set to the first level before input of the second command.

In particular, the first level corresponds to one of the first and second external power supply voltages, and the second level corresponds to the other, and the semiconductor memory device further includes an internal control signal generation circuit for receiving the external control signal and generating an internal control signal. The internal control signal generation circuit includes a first buffer operating in the low power consumption mode and driven with the first external power supply voltage, a second buffer operating in the normal mode, for receiving the external control signal driven with the internal power supply voltage, and a logic circuit for setting the internal control signal to either the internal power supply voltage or the second external power supply voltage according to the external control signal received by one of the first and second buffers that is in operation. The control circuit instructs the restoration in response to the internal control signal.

Thus, the internal control signal accurately reflecting level transition of the external control signal can be produced even in the low power consumption mode, enabling reliable restoration from the low power consumption mode to the normal mode.

Preferably, the internal power supply circuit further includes a buffer portion provided between the reference voltage generation portion and the internal power supply voltage generation portion, for transmitting the reference voltage from the reference voltage generation portion to the internal power supply voltage generation portion, and a second current shut-off switch for shutting off an operating current of the buffer portion in the low power consumption mode.

Since the reference voltage is thus transmitted to the internal power supply voltage generation portion through the buffer portion, variation in reference voltage due to noise or the like can be suppressed.

Preferably, the buffer portion includes an operating current control portion for controlling an operating current amount. The operating current control portion sets the operating current amount in a transition period from the low power consumption mode to the normal mode to a larger value than that in the normal mode.

In particular, in such a structure, the reference voltage generation portion sets the reference voltage to the second external power supply voltage in the low power consumption mode, and the transition period corresponds to a period during which the reference voltage is at a prescribed level or less.

Thus, the reference voltage can rise quickly upon restoration from the low power consumption mode to the normal mode, enabling rapid restoration of the internal power supply voltage.

According to another aspect of the invention, a semiconductor memory device capable of switching a level of an external power supply voltage includes: an internal circuit for conducting a data read operation, a data write operation and a data hold operation; an external power supply line receiving the external power supply voltage; an internal power supply line for transmitting an internal power supply voltage to the internal circuit; and an internal power supply circuit for receiving the external power supply voltage and supplying an internal power supply current to the internal power supply line so as to keep the internal power supply voltage at a target level. The operation of supplying the internal power supply current in the internal power supply circuit is switched according to the level of the external power supply voltage in order to maintain the same control response of the internal power supply voltage regardless of the level of the external power supply voltage.

Since the operation of supplying the internal power supply current is switched according to the level of the external power supply voltage, the control response of the internal power supply voltage can be maintained regardless of the level of the external power supply voltage.

Preferably, the internal power supply circuit includes a reference voltage generation portion for receiving the external power supply voltage and generating a reference voltage corresponding to the target level, a voltage comparison portion for producing a voltage at an internal node according to a comparison result between the reference voltage and the internal power supply voltage, and an internal power supply current supplying portion provided between the external power supply line and the internal power supply line, for supplying the internal power supply current to the internal power supply line with the same current supplying capability regardless of the level of the external power supply voltage. When the level of the external power supply voltage is higher than the target level, the internal power supply current supplying portion supplies the internal power supply current according to the voltage at the internal node, and in an external power supply voltage direct-coupling mode in which the level of the external power supply voltage corresponds to the target level, the internal power supply current supplying portion electrically couples the external power supply line to the internal power supply line so as to supply the internal power supply current.

In particular, in such a structure, the internal power supply current supplying portion includes a first driver transistor provided between the external power supply line and the internal power supply line, for supplying a current corresponding to the voltage at the internal node to the internal power supply line as the internal power supply current, a second driver transistor turned ON in the external power supply voltage direct-coupling mode, for electrically coupling the external power supply line to the internal power supply line, and a connection switch tuned ON in the external power supply voltage direct-coupling mode, for electrically coupling a voltage for turning ON the first driver transistor to the internal node.

Thus, even when the semiconductor memory device has the external power supply voltage direct-coupling mode in which the external power supply line is directly connected to the internal power supply line so as to supply the internal power supply voltage, control response of the internal power supply voltage can be maintained regardless of the level of the external power supply voltage.

Preferably, the internal power supply circuit includes a reference voltage generation portion for receiving the external power supply voltage and generating a reference voltage corresponding to the target level, a voltage comparison portion for producing a voltage at an internal node according to a comparison result between the reference voltage and the internal power supply voltage, a current shut-off switch for shutting off an operating current of the voltage comparison portion when the level of the external power supply voltage corresponds to the target level, a driver transistor provided between the external power supply line and the internal power supply line, for supplying a current corresponding to the voltage at the internal node to the internal power supply line as the internal power supply current, and a connection switch turned ON in an external power supply voltage direct-coupling mode in which the level of the external power supply voltage corresponds to the target level, for electrically coupling a voltage for turning ON the driver transistor to the internal node.

Thus, power consumption in the external power supply voltage direct-coupling mode can be reduced.

Preferably, the internal power supply circuit includes a voltage comparison portion for producing a voltage at a first internal node according to a comparison result between a reference voltage corresponding to the target level and the internal power supply voltage, and an internal power supply current supplying portion provided between the external power supply line and the internal power supply line, for supplying the internal power supply current to the internal power supply line according to the voltage at the first internal node. The internal power supply current supplying portion supplies the internal power supply current with the same current supplying capability regardless of the level of the external power supply voltage.

More preferably, the internal power supply current supplying portion includes a first driver transistor provided between the external power supply line and the internal power supply line, for supplying a current corresponding to the voltage at the first internal node to the internal power supply line as the internal power supply current, a second driver transistor provided between the external power supply line and the internal power supply line, for supplying a current corresponding to a voltage at a second internal node to the internal power supply line as the internal power supply current, a gate circuit for electrically coupling the first and second internal nodes to each other according to the level of the external power supply voltage, and a connection switch tuned ON complementarily to the gate circuit, for electrically coupling a voltage for turning OFF the second driver transistor to the second internal node.

Preferably, the internal power supply circuit includes a voltage comparison portion for producing a voltage at a first internal node according to a comparison result between a reference voltage corresponding to the target level and the internal power supply voltage, a driver transistor provided between the external power supply line and the internal power supply line, for supplying a current corresponding to the voltage at the first internal node to the internal power supply line as the internal power supply current, and a first operating current control portion for switching an operating current amount to be supplied to the voltage comparison portion according to the level of the external power supply voltage.

In such a semiconductor device, in the case where the applied level of the external power supply voltage is higher than the internal power supply voltage, control response of the internal power supply voltage can be maintained even if the level of the external power supply voltage is switched.

More preferably, the internal power supply circuit further includes a second operating current control portion for supplying a prescribed amount of operating current to the voltage comparison portion upon execution of a self-refresh command for conducting the data hold operation. The prescribed amount of operating current is smaller than the operating current amount supplied from the first operating current control portion, and supply of the operating current from the first operating current control portion is discontinued upon execution of the self-refresh command.

Thus, the operating current of the voltage comparison portion is reduced in the execution period of the self-refresh command during which the internal circuit consumes a small amount of current, whereby power consumption can further be reduced.

Preferably, the internal power supply voltage is higher than the external power supply voltage in a normal mode, and the internal power supply voltage includes a first detection portion operating both in an active period and a standby period, for sensing reduction in the internal power supply voltage to a level lower than the target level, a second detection portion operating in the active period, for sensing reduction in the internal power supply voltage to a level lower than the target level, a third detection portion operating in response to a sensing result of the first detection portion in a period other than during execution of a self-refresh command for the internal circuit, for sensing reduction in the internal power supply voltage to a level lower than the target level, a first booster unit operating in response to respective sensing results of the second and third detection portions, for boosting the external power supply voltage so as to supply the internal power supply current, and a second booster unit operating in response to the sensing result of the first detection portion, for boosting the external power supply voltage so as to supply the internal power supply current. The second booster unit is capable of supplying a larger amount of internal power supply current per unit time than the first booster unit.

More preferably, the first booster unit includes an oscillation portion for generating a pump clock having a predetermined cycle in response to the respective sensing results of the second and third detection portions, a pumping portion for setting a voltage at a first node to a value higher than the external power supply voltage in response to the pump clock, a transmission transistor electrically coupled between the first node and the internal power supply line, and a gate boosting portion for setting a gate voltage of the transmission transistor to a value higher than the external power supply voltage in response to the pump clock. The pumping portion includes a first pump capacitor coupled between a second node receiving the pump clock and the first node, a clock transmission circuit rendered in an operating state according to the level of the external power supply voltage, for transmitting the pump clock to a third node, and a second pump capacitor coupled between the first node and the third node.

In particular, the clock transmission circuit is forcibly set to the operating state in response to a signal applied in a test mode.

Preferably, the first booster unit includes a first oscillation portion for generating a first pump clock having a first cycle in response to the respective sensing results of the second and third detection portions, a first pumping portion for setting a voltage at a first node to a value higher than the external power supply voltage in response to the first pump clock, a first transmission transistor electrically coupled between the first node and the internal power supply line, and a first gate boosting portion for setting a gate voltage of the first transmission transistor to a value higher than the external power supply voltage in response to the first pump clock. The second booster unit includes a second oscillation portion for generating a second pump clock having a second cycle longer than the first cycle in response to the sensing result of the first detection portion, a second pumping portion for setting a voltage at a fourth node to a value higher than the external power supply voltage in response to the second pump clock, a second transmission transistor electrically coupled between the fourth node and the internal power supply line, and a second gate boosting portion for setting a gate voltage of the second transmission transistor to a value higher than the external power supply voltage in response to the second pump clock. The first and second gate boosting portions switch a boosting amount from the external power supply voltage according to the level of the external power supply voltage.

In such a semiconductor memory device, in the case where the internal power supply voltage is produced by boosting the external power supply voltage, control response of the internal power supply voltage can be maintained even if the level of the external power supply voltage is switched. More specifically, in this case, the control response of the internal power supply voltage can be maintained by switching the current supplying capability of the first and second booster units according to the level of the external power supply voltage.

Preferably, the first booster unit includes an oscillation portion for generating a pump clock having a predetermined cycle in response to the sensing results of the second and third detection portion and a pumping circuit for supplying the internal power supply current by charge pumping operation with the pump clock. The oscillation portion includes an odd number of inverters coupled in a cyclic manner, and a delay element coupled between the inverters. In particular, the delay element includes a diffused resistor formed on a semiconductor substrate.

Thus, the cycle of the pump clock can be kept stable regardless of the level of the external power supply voltage, whereby disturbance of the control over the internal power supply voltage can be suppressed.

Preferably, the internal power supply circuit includes a connection switch for electrically coupling the external power supply line to the internal power supply line in a low power consumption mode, and a current shut-off switch for shutting off an operating current of the first, second and third detection portions in the low power consumption mode. Thus, power consumption in the low power consumption mode can be reduced.

According to a further aspect of the invention, a semiconductor memory device to which one of a plurality of operating conditions is selectively applied includes an operation test control circuit for instructing, during operation testing, initiation of a prescribed test according to a specific combination of having a plurality of bits of a predetermined signal. The operation test control circuit includes a first test entry circuit for activating a first test entry signal in response to the specific combination, and a test entry overriding circuit for forcibly inactivating the first test entry signal when a specific one of the plurality of operating conditions is designated. The operation test control circuit initiates the prescribed test in response to activation of the first test entry signal.

Thus, whether a specific operating condition has been designated or not can be sensed in a simplified manner by checking if the prescribed test can be initiated in the operation test.

Preferably, the operation test control circuit further includes a second test entry circuit for activating a second test entry signal in response to another combination of the plurality of bits that is different from the specific combination. The operation test control circuit initiates the prescribed test in response to activation of either the first or second test entry signal.

Thus, the prescribed test can be initiated even when the specific operating condition has been designated.

Preferably, each of the operating conditions corresponds to a level of an external power supply voltage to be supplied. Thus, in the case where different levels of external power supply voltages are applicable, whether a specific external power supply voltage has been applied or not can be sensed in a simplified manner.

Preferably, each of the operating conditions corresponds to an amplitude voltage of a signal to be input/output. Thus, in the case where different levels of I/O signals are applicable, whether an I/O signal of a specific voltage level has been applied or not can be sensed in a simplified manner.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a schematic block diagram showing the overall structure of a semiconductor memory device according to a first embodiment of the present invention.

FIG. 13 is a diagram illustrating the difference in level of the internal power supply voltages depending on the level of external power supply voltage.

DESCRIPTION OF THE PREFERRED EMBODIMENTS

Figures 2, 3, 4:
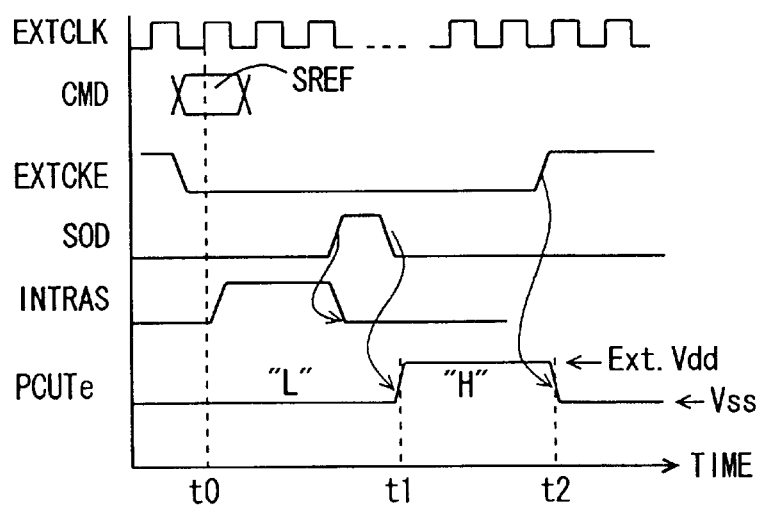
FIG. 2 is a diagram illustrating setting of internal power supply voltages in a normal mode and a deep power-down mode.
FIG. 3 is a diagram illustrating the configuration of address bits used for mode register setting.
FIG. 4 is a timing chart illustrating an example of a method for entering the deep power-down mode.

Hereinafter, embodiments of the present invention will be described in detail with reference to the accompanying drawings. Note that the same reference numerals and characters denote the same or corresponding portions throughout the figures.

First Embodiment

Referring to FIG. 1, a semiconductor memory device 1000 according to the first embodiment of the present invention includes a memory array portion 10. The memory array portion 10 includes a memory cell array 20, a row-selecting portion 30, and a column-selecting portion and sense amplifier 40.

The memory cell array 20 has a plurality of memory cells MC arranged in a matrix. The structure of the memory cell MC is not particularly limited, and various types of DRAM (Dynamic Random Access Memory) cells are applicable to the present invention.

Word lines WL for row selection are arranged respectively corresponding to the memory cell rows. Bit line pairs BLP are arranged respectively corresponding to the memory cell columns. Each bit line pair BLP is formed from complementary bit lines BL and /BL. The memory cells MC in each memory cell row are coupled to either the bit line BL or /BL. FIG. 1 exemplarily shows a word line and a bit line pair corresponding to a single memory cell MC.

The row-selecting portion 30 selectively activates a word line WL of the selected row according to an address signal. Each memory cell on the selected row is connected to a corresponding bit line BL or /BL. The column-selecting portion and sense amplifier 40 includes a sense amplifier for amplifying the voltage difference between the bit lines BL and /BL of each bit line pair BLP, and a column-selecting portion for selecting a bit line pair BLP of the selected column according to the address signal.

The semiconductor memory device 1000 further includes a first-stage input circuit 50, a peripheral circuitry control portion 60, memory array portion control circuits 70, 75, and an output circuit 80.

The first-stage input circuit 50 receives an external input signal that collectively indicates a clock, command, address, and write data. The peripheral circuitry control portion 60 produces a control signal for executing a command that is indicated by the input signal transmitted through the first-stage input circuit 50, and transmits this control signal to the internal circuitry such as memory array portion control circuits 70, 75.

The external commands include a read command READ designating a data read operation, a write command WRITE designating a data write operation, a mode register set command MRS for updating the content retained in a mode register, a no-operation command NOP designating no operation state, a bank active command ACT for activating a specific bank, a bank precharge command PRE for precharging a specific bank, an auto-refresh command AREF, a self-refresh command SREF, and the like.

The auto-refresh command AREF and the self-refresh command SREF designate a data hold operation (refresh operation) for preventing the data stored in the memory cell array 20 from disappearing.

In the refresh operation, the word lines WL are sequentially activated, so that the data in the memory cells corresponding to the activated word line is read, amplified and re-written by the sense amplifier.

The auto-refresh command AREF is applied during random access operation such as data read operation and data write operation. The self-refresh command SREF is applied during a standby period such as battery backup period in order to retain the information stored in the memory array portion 10.

The peripheral circuitry control portion 60 includes a mode register 65. The mode register 65 retains address bits of an address that is applied in response to the external mode register set command MRS. Various settings regarding latency, burst operation and the like are conducted according to the address bits retained in the mode register 65.

The memory array portion control circuit 70 controls the row-related operation for the memory array portion 10 in response to a row-related operation control signal SGr from the peripheral circuitry control portion 60. The memory array portion control circuit 75 controls the column-related operation for the memory array portion 10 in response to a column-related operation control signal SGc from the peripheral circuitry control portion 60.

The output circuit 80 externally outputs the read data from the memory array portion 10 in response to the read command READ.

The semiconductor memory device 1000 further includes an internal power supply circuit 100. The internal power supply circuit 100 receives an external power supply voltage Ext.Vdd and a ground voltage Vss from an external power supply line 90 and a ground line 95, respectively, and produces internal power supply voltages.

The internal power supply voltages include a word line voltage VPP, a substrate voltage VBB, a cell plate voltage VCP, a bit line voltage VBL, a peripheral circuitry power supply voltage VDDP, and a memory array power supply voltage VDDS. The cell plate voltage VCP and the bit line voltage VBL are set to half the memory array power supply voltage VDDS.

The internal power supply circuit 100 also produces a reference voltage for external input signal, VREFI. The first-stage input circuit 50 recognizes the level (H level/L level) of the input signal based on the reference voltage VREFI.

The word line voltage VPP, substrate voltage VBB, cell plate voltage VCP and bit line voltage VBL are supplied to the memory array portion 10. The memory array power supply voltage VDDS is supplied to the memory array portion control circuits 70 and 75. The peripheral circuitry power supply voltage VDDP is supplied to the peripheral circuitry control portion 60.

The peripheral circuitry control portion 60 switches the operation mode of the semiconductor memory device 1000 to the low power consumption mode based on a prescribed external command. In the low power consumption mode, the peripheral circuitry control portion 60 activates a power-cut signal PCUTe to H level. Power consumption in the internal power supply circuit 100 is reduced in response to activation of the power-cut signal PCUTe.

Note that, as is apparent from the following description, the low power consumption mode of the present embodiment is advanced over the conventional low power consumption mode using the self-refresh command SREF and the like in which the storage data in the memory array portion 10 is retained. In other words, the low power consumption mode of the present embodiment is intended to implement the operation with further reduced power consumption. Therefore, the low power consumption mode in the semiconductor memory device 1000 is hereinafter referred to as "deep power-down mode".

Hereinafter, setting of the internal power supply voltage level in the deep power-down mode will be described.

Referring to FIG. 2, in the normal mode, the peripheral circuitry power supply voltage VDDP is set to 2.5 V. Accordingly, in the case of the 2.5 V-level external operating power supply voltage, the external power supply voltage Ext.Vdd is directly used as the peripheral circuitry power supply voltage VDDP. Otherwise, e.g., in the case of the 2.7 V-level external power supply voltage, the external power supply voltage Ext.Vdd is down converted to produce the peripheral circuitry power supply voltage VDDP.

In the deep power-down mode, in the case of the 2.5 V-level external power supply voltage Ext.Vdd, the external power supply voltage Ext.Vdd can be directly used as the peripheral circuitry power supply voltage VDDP as in the normal mode. In the case of the 2.7 V-level external power supply voltage, however, the external power supply voltage Ext.Vdd is down converted by Vtn to produce the peripheral circuitry power supply voltage VDDP. Vtn corresponds to a threshold voltage of an N-type transistor provided in the internal power supply circuit 100. Production of the internal power supply voltage in the deep power-down mode will be described in detail below.

In the normal mode, the memory array power supply voltage VDDS is set to 2.0 V by down converting the external power supply voltage Ext.Vdd. In the deep power-down mode, the memory array power supply voltage VDDS is set to "Ext.Vdd−Vtn" as in the case of the peripheral circuitry power supply voltage VDDP.

In the normal mode, the bit line voltage VBL and the cell plate voltage VCP are set to half the memory array power supply voltage VDD, i.e., 1.0 V. In the deep power-down mode, supply of the bit line voltage VBL and the cell plate voltage VCP is discontinued, and corresponding internal power supply lines are rendered in an open state.

The substrate voltage VBB is set to −1.0 V in the normal mode, and set to 0 V, i.e., the ground voltage Vss, in the deep power-down mode.

In the normal mode, the word line voltage VPP is set to 3.7 V by boosting the external power supply voltage Ext.Vdd. In the deep power-down mode, the word line voltage VPP is set to Ext.Vdd or "Ext.Vdd−Vtn" as in the case of the peripheral circuitry power supply voltage VDDP.

Note that the levels of the internal power supply voltages in the normal mode shown in FIG. 2 are by way of example only. The deep power-down mode of the present invention is applicable even when these internal power supply voltages are set to other voltage levels.

Hereinafter, a method for entering the deep power-down mode will be described.

FIG. 3 shows the configuration of address bits used for mode register setting.

Referring to FIG. 3, address bits A0 to A11, BA0, BA1 input by the mode register set command MRS are retained in the mode register 65.

Part of the operating state of the semiconductor memory device 1000 is set according to the address bits retained in the mode register 65. For example, address bits A0 to A2 retained in the mode register 65 indicate setting of the burst length. Address bit A3 indicates setting of the burst type (sequential/interleave), and address bits A4 to A6 indicate setting of the latency mode, i.e., the number of clock cycles corresponding to the CAS latency. Address bit A9 indicates setting of the write mode (1-bit write/burst write).

Whether the deep power-down mode is applied in the semiconductor memory device 1000 or not is set by using an address bit that is not used for the normal mode-register setting. For example, mode register setting for setting application of the deep power-down mode, that is, for setting entry into the deep power-down mode when prescribed conditions are satisfied, is conducted by using address bits A7 and A8 that are not used for the mode register setting described above.

FIG. 4 shows an example of a method for entering the deep power-down mode in the semiconductor memory device 1000.

Referring to FIG. 4, a command CMD is input to the semiconductor memory device 1000 in synchronization with an external clock EXTCLK. An external self-refresh command SREF is applied at time t0. When the self-refresh command SREF is input, an external clock enable signal EXTCKE is set to L level.

In response to this, an instruction to conduct the refresh operation is given in the semiconductor memory device

1000. An internal control signal INTRAS is activated to H level in order to activate a word line to be subjected to the refresh operation. Thus, the data in the memory cells corresponding to the activated word line are read, amplified and rewritten.

When one row-related operation is completed and the internal control signal INTRAS changes from H level to L level, a control signal S0D is responsively activated to H level for a prescribed period. At the time when the activated control signal S0D is inactivated, every word line WL in the memory array portion 10 is inactive and each bit line BL, /BL is in the precharged state.

In the case where the deep power-down mode is applied by the mode register setting, the power-cut signal PCUTe is activated to H level at time t1 in response to inactivation of the control signal S0D (from H level to L level). Accordingly, the internal operation of the internal power supply circuit 100 is switched. Thus, the internal power supply voltages are set to the voltage levels of the deep power-down mode shown in FIG. 2.

In other words, in the case where application of the deep power-down mode is set by the mode register set command MRS, transition from the normal mode to the deep power-down mode is conducted after completion of at least one row-related operation and the bit-line precharge operation, in response to a request for the self-refresh command SREF.

Thus, transition to the deep power-down mode can be conducted while the memory array portion 10 is stable, that is, during a period other than the period during which the word line is activated and the data is read from the corresponding memory cells.

Restoration from the deep power-down mode to the normal mode is conducted in response to activation of the external clock enable signal EXTCKE (from L level to H level). More specifically, the power-cut signal PCUTe is inactivated to L level at time t2 in response to activation of the external clock enable signal EXTCKE. As a result, the deep power-down mode is terminated, and the internal operation of the internal power supply circuit 100 is switched again. Thus, the internal power supply voltages are set to the voltage levels of the normal mode shown in FIG. 2.

Note that the power-cut signal PCUTe is set to the ground voltage Vss in the inactive state (L level), and to the external power supply voltage Ext.Vdd in the active state (H level).

In the case where the deep power-down mode is not applied by the mode register setting, the self-refresh command SREF is executed to sequentially conduct the refresh operation.

Figure 5:
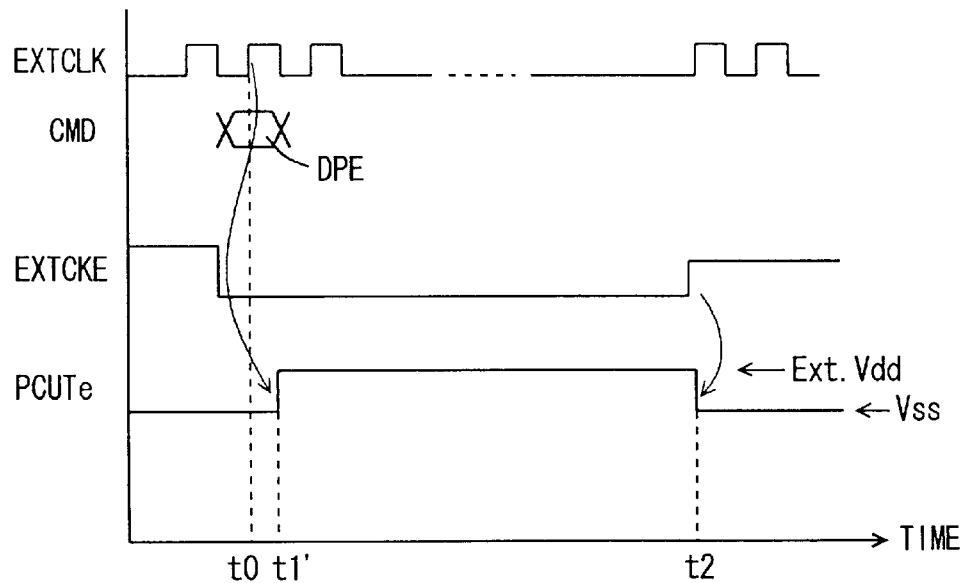
FIG. 5 is a timing chart illustrating another example of the method for entering the deep power-down mode.

FIG. 5 is a timing chart illustrating another example of the method for entering the deep power-down mode.

Referring to FIG. 5, in the case where the deep power-down mode is applied by the mode register setting, transition to the deep power-down mode may be conducted by using a prescribed special command other than the self-refresh command SREF.

For example, a deep power-down mode entry command DPE defined as the aforementioned special command is input at time t0. In response to this, the power-cut signal PCUTe is activated to H level at time t1'.

Restoration from the deep power-down mode to the normal mode is conducted in response to activation of the external clock enable signal EXTCKE as in the case of FIG. 4. More specifically, the power-cut signal PCUTe is inactivated to L level in response to activation of the external clock enable signal EXTCKE at time t2. Thus, the deep power-down mode is terminated, and the internal power supply voltages are set to the voltage levels of the normal mode shown in FIG. 2.

Hereinafter, the structure of the internal power supply circuit 100 in FIG. 1 will be described.

First, the structure of a portion of the internal power supply circuit 100 that corresponds to the normal mode will be described.

Figure 6:
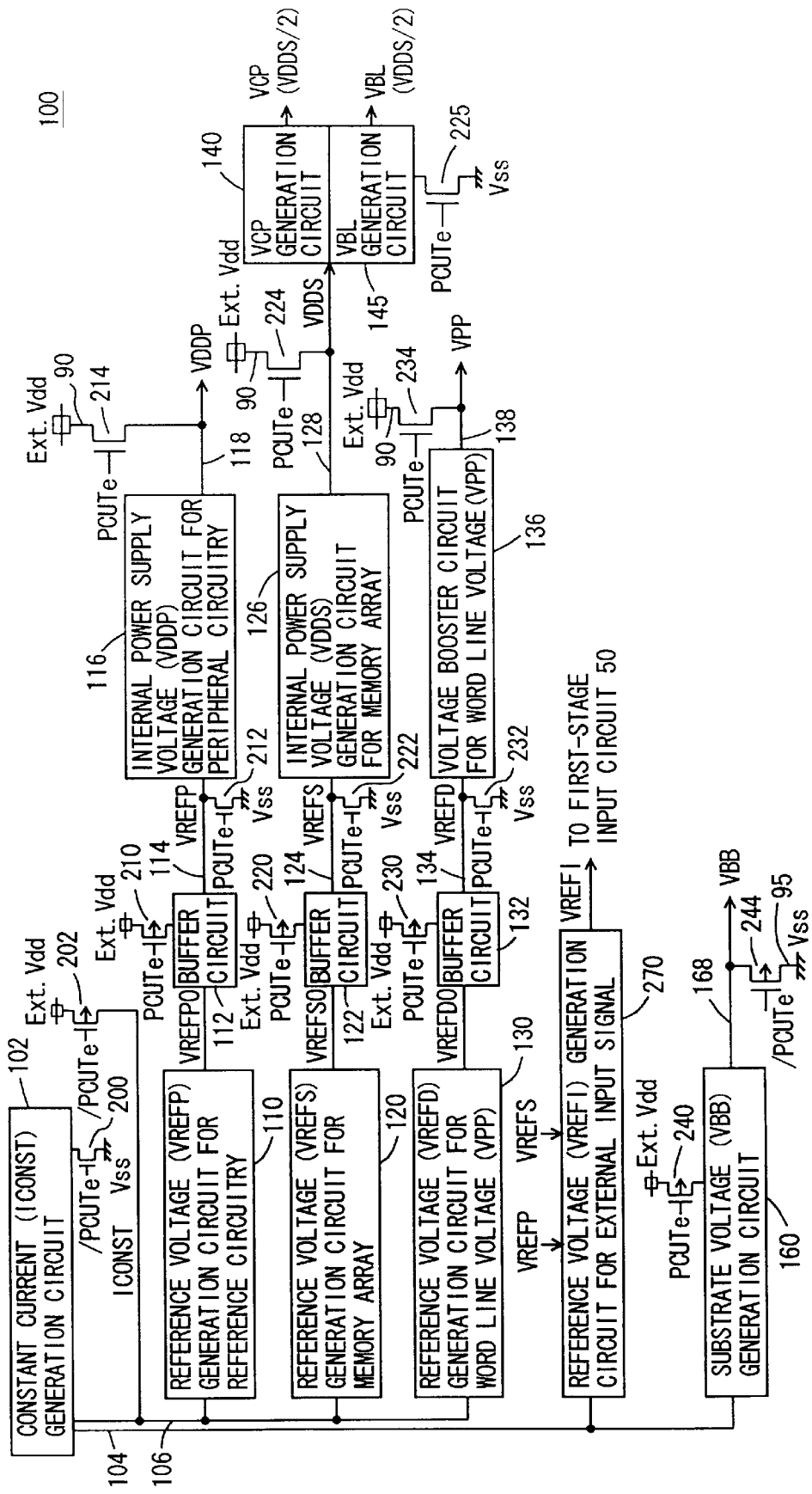
FIG. 6 is a block diagram showing the structure of an internal power supply circuit in FIG. 1.

Referring to FIG. 6, the internal power supply circuit 100 includes a constant current generation circuit 102. The constant current generation circuit 102 supplies a constant current ICONST to constant current supply lines 104 and 106.

The internal power supply circuit 100 further includes a reference voltage generation circuit 110, a buffer circuit 112 and an internal power supply voltage generation circuit 116 in order to produce the peripheral circuitry power supply voltage VDDP.

The reference voltage generation circuit 110 receives the constant current ICONST from the constant current supply line 106, and generates a reference voltage VREFP0 corresponding to the target level of the peripheral circuitry power supply voltage VDDP. The buffer circuit 112 produces a reference voltage VREFP onto a reference voltage line 114 based on the reference voltage VREFP0 from the reference voltage generation circuit 110.

The internal power supply voltage generation circuit 116 down converts the external power supply voltage Ext.Vdd to output the peripheral circuit power supply voltage VDDP onto an internal power supply line 118. In the normal mode, the internal power supply voltage generation circuit 116 attempts to keep the peripheral circuitry power supply voltage VDDP at the target level based on the comparison between the peripheral circuitry power supply voltage VDDP and the reference voltage VREFP.

The internal power supply circuit 100 further includes a reference voltage generation circuit 120, a buffer circuit 122 and an internal power supply voltage generation circuit 126 in order to produce the memory array power supply voltage VDDS.

The reference voltage generation circuit 120 receives the constant current ICONST from the constant current supply line 106, and generates a reference voltage VREFS0 corresponding to the target level of the memory array power supply voltage VDDS. The buffer circuit 122 produces a reference voltage VREFS onto a reference voltage line 124 based on the reference voltage VREFS0 from the reference voltage generation circuit 120.

The internal power supply voltage generation circuit 126 down converts the external power supply voltage Ext.Vdd to output the memory array power supply voltage VDDS onto an internal power supply line 128. In the normal mode, the internal power supply voltage generation circuit 126 attempts to keep the memory array power supply voltage VDDS at the target level based on the comparison between the memory array power supply voltage VDDS and the reference voltage VREFS.

The internal power supply circuit 100 further includes a reference voltage generation circuit 130, a buffer circuit 132 and a voltage booster circuit 136 in order to produce the word line voltage VPP.

The reference voltage generation circuit 130 receives the constant current ICONST from the constant current supply line 106, and generates a reference voltage VREFD0 corresponding to the target level of the word line voltage VPP. The buffer circuit 132 produces a reference voltage VREFD onto a reference voltage line 134 based on the reference voltage VREFD0 from the reference voltage generation circuit 130.

The voltage booster circuit 136 boosts the external power supply voltage Ext.Vdd to output the word line voltage VPP onto an internal power supply line 138. In the normal mode, the voltage booster circuit 136 attempts to keep the word line voltage VPP at the target level based on the comparison between the word line voltage VPP and the reference voltage VREFD.

The reference voltages VREFP0 and VREFP, VREFS0 and VREFS, VREFD0 and VREFD are determined corresponding to the levels of the peripheral circuitry power supply voltage VDDP, the memory array power supply voltage VDDS and the word line voltage VPP in the normal mode shown in FIG. 2.

A commonly used voltage down converter (VDC) can be applied to the internal power supply voltage generation circuits 116 and 126 for down converting the external power supply voltage Ext.Vdd.

The internal power supply circuit 100 further includes a VCP generation circuit 140 for receiving the memory array power supply voltage VDDS and generating the cell plate voltage VCP, and a VBL generation circuit 145 for receiving the memory array power supply voltage VDDS and generating the bit line voltage VBL. The VCP generation circuit 140 and the VBL generation circuit 145, which are formed from, e.g., a voltage divider circuit having a trimming function, receive the memory array power supply voltage VDDS from the internal power supply line 128 and generate the cell plate voltage VCP and the bit line voltage VBL, respectively.

The internal power supply circuit 100 further includes a substrate voltage generation circuit 160. The substrate voltage generation circuit 160 receives the external power supply voltage Ext.Vdd, and generates a negative substrate voltage VBB onto an internal power supply line 168. For example, the substrate voltage generation circuit 160 is formed from a charge pump circuit.

With such a structure, the internal power supply voltages in the normal mode are set to the levels shown in FIG. 2.

Hereinafter, the structure of a portion of the internal power supply circuit 100 that corresponds to the deep power-down mode will be described.

The internal power supply circuit 100 further includes a PMOS transistor 210 for shutting off an operating current of the buffer circuit 112 in the deep power-down mode, an NMOS transistor 212 for electrically coupling the reference voltage line 114 to the ground voltage Vss in the deep power-down mode, and an NMOS transistor 214 for electrically coupling the internal power supply line 118 to the external power supply voltage Ext.Vdd in the deep power-down mode.

The PMOS transistor 210 is electrically coupled between the external power supply voltage Ext.Vdd and the buffer circuit 112, and receives the power-cut signal PCUTe at its gate. The NMOS transistor 212 is electrically coupled between the reference voltage line 114 and the ground voltage Vss, and receives the power-cut signal PCUTe at its gate. The NMOS transistor 214 is electrically coupled between the external power supply line 90 and the internal power supply line 118, and receives the power-cut signal PCUTe at its gate.

Note that, in the present embodiment, the MOS transistors are applied as a typical example of the field effect transistors used as connection switches.

The internal power supply circuit 100 further includes a PMOS transistor 220 and NMOS transistors 222, 224, which are provided for the circuitry relating to production of the memory array power supply voltage VDDS. The internal power supply circuit 100 also includes a PMOS transistor 230 and NMOS transistors 232, 234, which are provided for the circuitry relating to production of the word line voltage VPP.

The NMOS transistors 222, 232 are arranged in the same manner as that of the NMOS transistor 212. The NMOS transistors 224,234 are arranged in the same manner as that of the NMOS transistor 214. The threshold voltage of the NMOS transistors 214, 224 and 234 corresponds to Vtn in FIG. 2. The NMOS transistor 234 may be replaced with a PMOS transistor receiving an inverted power-cut signal /PCUTe at its gate. In this case, the word line voltage VPP in the deep power-down mode can be set to Ext.Vdd.

This structure enables the peripheral circuitry power supply voltage VDDP, the memory array power supply voltage VDDS and the word line voltage VPP is set to "Ext.Vdd–Vtn" in the deep power-down mode with discontinuing the operations of the internal power supply voltage generation circuits 116, 126 and the voltage booster circuit 136. Accordingly, the reference voltages VREFP, VREFS, VREFD to be respectively applied to the internal power supply voltage generation circuits 116, 126 and the voltage booster circuit 136 need not be produced in the deep power-down mode. In the deep power-down mode, the reference voltages VREFP, VREFS and VREFD are therefore fixed to the ground voltage Vss by the transistors 212, 222 and 232, respectively.

This eliminates the need to operate the reference voltage generation circuits 110, 120, 130 and the buffer circuits 112, 122, 132 of the previous stage, allowing for reduction in power consumption in this circuit group.

The internal power supply circuit 100 further includes an NMOS transistor 200 for disconnecting the constant current generation circuit 102 from the ground voltage Vss in the deep power-down mode, and a PMOS transistor 202 for electrically coupling the constant current supply line 106 to the external power supply voltage Ext.Vdd in the deep power-down mode.

The NMOS transistor 200 is electrically coupled between the constant current generation circuit 102 and the ground voltage Vss, and receives the power-cut signal PCUTe at its gate. The PMOS transistor 202 is electrically coupled between the external power supply voltage Ext.Vdd and the constant current supply line 106, and receives the inverted power-cut signal /PCUTe at its gate.

As a result, in the deep power-down mode, supply of the constant current ICONST from the constant current generation circuit 102 is discontinued, resulting in reduction in power consumption. The constant current supply line 106 is fixed to the external power supply voltage Ext.Vdd by the transistor 202.

Since the reference voltage generation circuits 110, 120, 130 of FIG. 6 have the same structure, the structure of the reference voltage generation circuit 110 will be exemplarily described in connection with FIG. 7.

Figure 7:
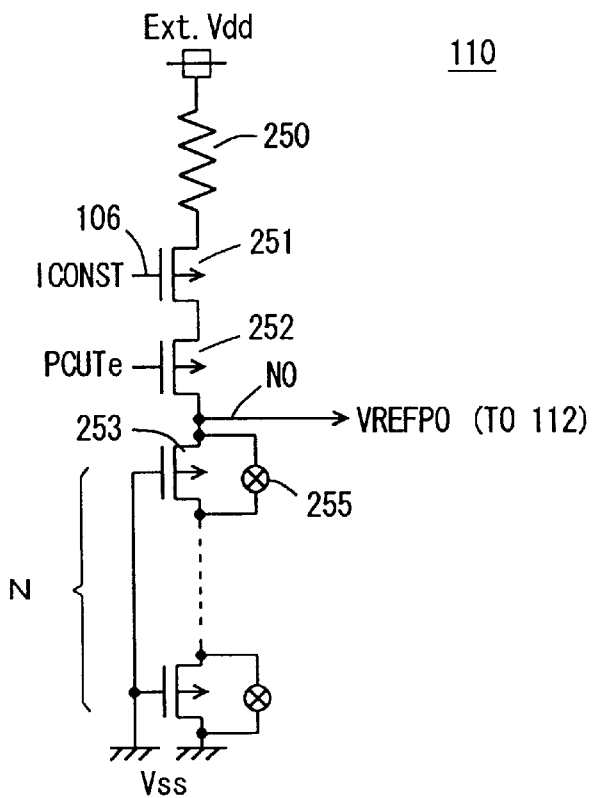
FIG. 7 is a circuit diagram showing the structure of a reference voltage generation circuit in FIG. 6.

Referring to FIG. 7, the reference voltage generation circuit 110 includes a resistor 250 and PMOS transistors 251, 252, which are coupled in series between the external power supply voltage Ext.Vdd and a node N0. The reference voltage VREFP0 is produced at the node N0. The reference voltage VREFP0 is transmitted to the buffer circuit 112.

The gate of the PMOS transistor 251 is coupled to the constant current supply line 106. The power-cut signal PCUTe is applied to the gate of the PMOS transistor 252.

The reference voltage generation circuit 110 further includes N PMOS transistors 253 (where N is a natural number) coupled in series between the node N0 and the ground voltage Vss. The N PMOS transistors 253 have their respective gates coupled to the ground voltage Vss. Each of the N PMOS transistors 253 thus functions as a resistive element.

With such a structure, in the normal mode in which the power-cut signal PCUTe is rendered in an inactive state (L level), the reference voltage generation circuit 110 produces the reference voltage VREFP0 using an operating current produced between the external power supply voltage Ext.Vdd and the ground voltage Vss. By appropriately adjusting the electric resistance value between the node N0 and the ground voltage Vss, a desired reference voltage VREFP0 can be obtained.

As shown in FIG. 7, a bypassing fuse element 255 is provided in parallel with the respective PMOS transistor 253. This enables fine adjustment of the electric resistance value between the node N0 and the ground voltage Vss by fuse blowing.

In the deep power-down mode in which the power-cut signal PCUTe is rendered in an active state (H level), the PMOS transistor 252 is turned OFF. Therefore, a through current between the external power supply voltage Ext.Vdd and the ground voltage Vss, i.e., an operating current of the reference voltage generation circuit 110, is shut off.

In the deep power-down mode, the reference voltage VREFP0 is not required, and therefore generation thereof is discontinued by shutting off the operating current, thereby allowing for reduction in power consumption of the reference voltage generation circuit 110.

Since the buffer circuits 112, 122 and 132 in FIG. 6 have the same structure, the structure of the buffer circuit 112 will be exemplarily described in connection with FIG. 8.

Figure 8:
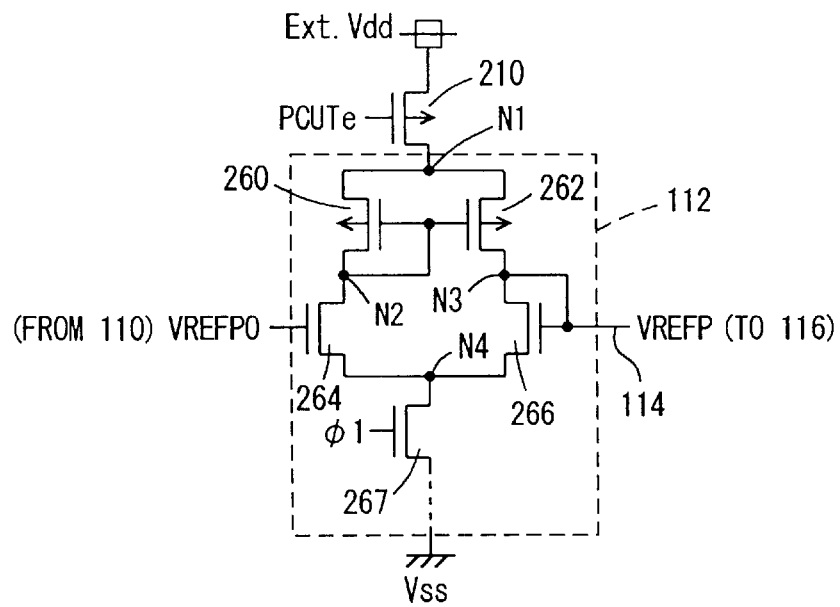
FIG. 8 is a circuit diagram showing the structure of a buffer circuit in FIG. 6.

Referring to FIG. 8, the buffer circuit 112 includes a PMOS transistor 260 electrically coupled between nodes N1 and N2, a PMOS transistor 262 electrically coupled between nodes N1 and N3, an NMOS transistor 264 electrically coupled between nodes N2 and N4, and an NMOS transistor 266 electrically coupled between nodes N3 and N4. The node N1 is electrically coupled to the external power supply voltage Ext.Vdd through the PMOS transistor 210.

The PMOS transistors 260 and 262 have their respective gates coupled to the node N2. The reference voltage VREFP0 from the reference voltage generation circuit 110 is applied to the gate of the NMOS transistor 264. The node N3 and the gate of the transistor 266 are coupled to the reference voltage line 114 for transmitting the reference voltage VREFP.

The buffer circuit 112 further includes an NMOS transistor 267 electrically coupled between the node N4 and the ground voltage Vss. A control voltage φ is applied to the gate of the NMOS transistor 267.

With such a structure, in the normal mode in which the transistor 210 is turned ON, an operating current according to the control voltage φ1 is supplied to the buffer circuit 112. The buffer circuit 112 sets the reference voltage VREFP to be transmitted to the internal power supply voltage generation circuit 116 to the same level as that of the reference voltage VREFP0 from the reference voltage generation circuit 110 at the response speed according to the operating current amount. Transmitting the reference voltage through the buffer circuit 112 can prevent the reference voltage VREFP from varying due to noise or the like.

In the deep power-down mode, the transistor 210 is turned OFF in response to activation (H level) of the power-cut signal PCUTe, whereby an operating current of the buffer circuit 112 is shut off. Since the reference voltage VREFP is not required in the deep power-down mode, generation thereof is thus discontinued, thereby allowing for reduction in power consumption in the buffer circuit 112.

Referring back to FIG. 6, the internal power supply circuit 100 further includes a PMOS transistor 240 for disconnecting the substrate voltage generation circuit 160 from the external power supply voltage Ext.Vdd in the deep power-down mode, and a PMOS transistor 244 for electrically coupling the internal power supply line 168 to the ground voltage Vss. The power-cut signal PCUTe is applied to the gate of the PMOS transistor 240. The inverted power-cut signal /PCUTe is applied to the gate of the PMOS transistor 244.

Accordingly, in the deep power-down mode, the PMOS transistor 240 is turned OFF, and the PMOS transistor 244 is turned ON. As a result, the substrate voltage VBB is set to the ground voltage Vss as shown in FIG. 2. Since the substrate voltage generation circuit 160 need not be operated in the deep power-down mode, an operating current of the substrate voltage generation circuit 160 is shut off in response to turning-OFF of the PMOS transistor 240, allowing for reduction in power consumption in the substrate voltage generation circuit 160.

The internal power supply circuit 100 further includes an external input signal reference voltage generation circuit 270 for generating a reference voltage for external input signal, VREFI. The reference voltage for external input signal, VREFI, is transmitted to the first-stage input circuit 50 and used to recognize the level (H level or L level) of the input signal.

Figure 9:
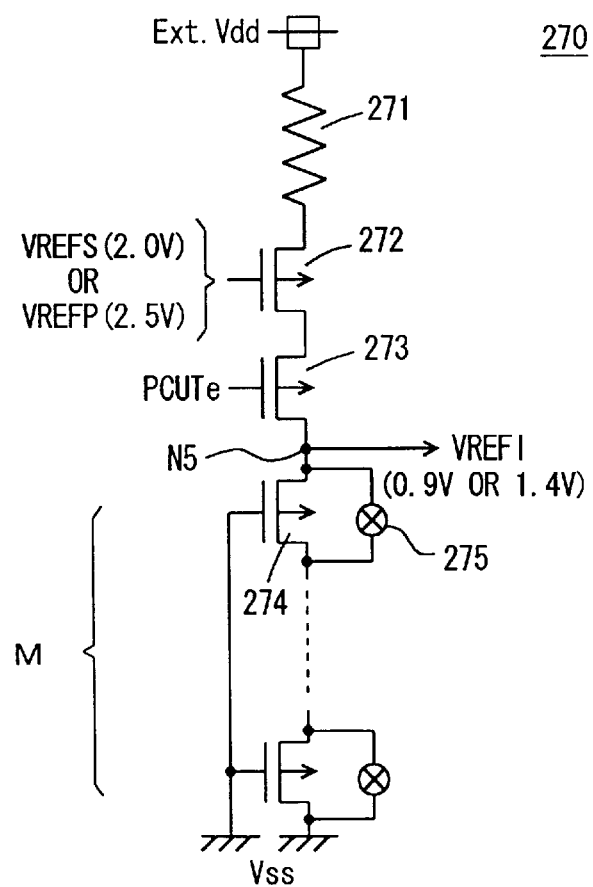
FIG. 9 is a circuit diagram showing the structure of an external input signal reference voltage generation circuit in FIG. 6.

Referring to FIG. 9, the external input signal reference voltage generation circuit 270 includes a resistor 271 and PMOS transistors 272, 273, which are coupled in series between the external power supply voltage Ext.Vdd and a node N5. The reference voltage for external input signal, VREFI, is produced at the node N5.

The external input signal reference voltage generation circuit 270 further includes M PMOS transistors 274 (where M is a natural number) coupled in series between the node N5 and the ground voltage Vss. The M PMOS transistors 274 have their respective gates coupled to the ground voltage Vss. Each of the M transistors 274 thus functions as a resistive element.

Either the reference voltage VREFS or VREFP is selectively applied to the gate of the PMOS transistor 272. The power-cut signal PCUTe is applied to the gate of the PMOS transistor 272.

This structure enables switching of the level of the reference voltage for external input signal, VREFI, in the normal mode. For example, in the case where the reference voltage VREFP (2.5 V) is applied to the gate of the PMOS transistor 272, the reference voltage for external input signal, VREFI, is set to 1.4 V. In the case where the reference voltage VREFS (2.0 V) is applied to the gate of the PMOS transistor 272, the reference signal for external input signal, VREFI, is set to 0.9 V. Thus, the reference voltage for external input signal, VREFI, can be switched in level for the input signals of different I/O signal levels.

As shown in FIG. 9, a bypassing fuse element 275 is provided in parallel with the respective PMOS transistor 274. This enables fine adjustment of the level of the reference voltage for external input signal, VREFI, by fuse blowing.

In the deep power-down mode, no external input signal is applied, and therefore the reference voltage for external input signal, VREFI, is not required. Accordingly, in the deep power-down mode, the PMOS transistor 273 is turned OFF in response to activation (H level) of the power-cut signal PCUTe so as to shut off the operating current, thereby allowing for reduction in power consumption in the external input signal reference voltage generation circuit 270.

As has been described above, power consumption in the deep power-down mode can be significantly reduced in the internal power supply circuit 100.

The power-cut signal PCUTe is applied to the gates of the NMOS transistors 214, 224, 234 and the like for shutting off the external power supply voltage Ext.Vdd. Therefore, L level and H level of the power-cut signal PCUTe must be set to the ground voltage Vss and the external power supply voltage Ext.Vdd, respectively.

Hereinafter, the structure for smooth restoration from the deep power-down mode will be described.

As described before, restoration from the deep power-down mode to the normal mode is conducted in response to the external clock enable signal EXTCKE. In the semiconductor memory device 1000, such restoration of the mode is controlled based on an internal clock enable signal INTCKE that is produced by buffering the external clock enable signal EXTCKE. Accordingly, the internal dock enable signal INTCKE must be produced so as to accurately reflect the level transition of the external clock enable signal EXTCKE even when the peripheral circuitry power supply voltage VDDP is set to "Ext.Vdd−Vtn" in the deep power-down mode.

Figure 10:
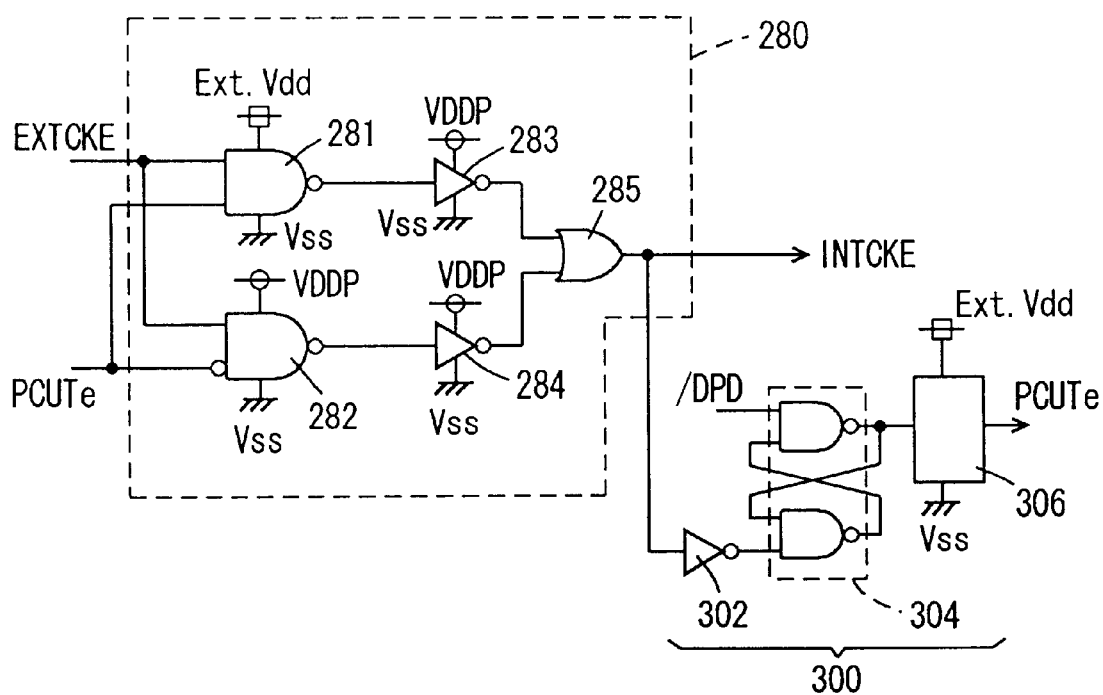
FIG. 10 is a circuit diagram showing the structure of an internal clock enable signal generation circuit.

An internal clock enable signal generation circuit 280 of FIG. 10 is provided in, e.g., the first-stage input circuit 50.

Referring to FIG. 10, the internal dock enable signal generation circuit 280 includes a logic gate 281 driven with the external power supply voltage Ext.Vdd, and logic gates 282 to 285 driven with the peripheral circuitry power supply voltage VDDP.

The logic gate 281 outputs the NAND operation result of the external clock enable signal EXTCKE and the power-cut signal PCUTe. The logic gate 282 outputs the NAND operation result of the external dock enable signal EXTCKE and the inverted power-cut signal.

Thus, in the deep power-down mode in which the power-cut signal PCUTe is set to H level, the logic gate 281 operates as a buffer of the external dock enable signal EXTCKE. In the normal mode in which the power-cut signal PCUTe is set to L level, the logic gate 282 operates as a buffer receiving the external dock enable signal EXTCKE.

The logic gates (inverters) 283, 284 invert the outputs of the logic gates 281, 282, respectively. The logic gate 285 outputs the OR operation result of the respective outputs of the inverters 283, 284 as the internal clock enable signal INTCKE.

Thus, in the normal mode, the buffer (logic gate 282) driven with the peripheral circuitry power supply voltage VDDP produces the internal clock enable signal INTCKE. In the deep power-down mode, the buffer (logic gate 281) driven with the external power supply voltage Ext.Vdd produces the internal clock enable signal INTCKE.

As a result, in both the normal mode and the deep power-down mode, the internal clock enable signal INTCKE can be produced so as to accurately reflect the level transition of the external clock enable signal EXTCKE.

The internal clock enable signal INTCKE is transmitted to a power-cut signal generation circuit 300 included in the peripheral circuitry control portion 60.

The power-cut signal generation circuit 300 includes an inverter 302, a flip-flop 304 and a level converter circuit 306. The inverter 302 and the flip-flop 304 are driven with the peripheral circuitry power supply voltage VDDP.

The inverter 302 inverts the internal clock enable signal INTCKE for output. The output of the inverter 302 is applied to the flip-flop 304 as reset input. A control signal /DPD is applied to the set input of the flip-flop 304. The control signal /DPD is a signal that is set to L level when the conditions for entering the deep power-down mode are satisfied. For example, according to the entry method of FIG. 4, the control signal /DPD is activated to L level in response to inactivation of the control signal S0D. According to the entry method of FIG. 5, the control signal /DPD is activated to L level in response to the deep power-down mode entry command DPE.

Accordingly, the output signal of the flip-flop 304 is set to H level in response to activation of the control signal /DPD to L level, and reset to L level in response to transition of the internal clock enable signal INTCKE to H level.

The level converter circuit 306 converts the level of the output signal of the flip-flop 304 to the amplitude in the range from the ground voltage Vss to the external power supply voltage Ext.Vdd so as to produce the power-cut signal PCUTe.

Thus, the power-cut signal PCUTe can be set according to the mode entry methods of FIGS. 4 and 5. Moreover, restoration from the deep power-down mode to the normal mode can be reliably conducted.

Upon restoration from the deep power-down mode to the normal mode, the internal power supply voltage generation circuits 116, 126 and the voltage booster circuit 136 within the internal power supply circuit must be quickly operated to switch the internal power supply voltages again. Accordingly, the reference voltages VREFP, VREFS, VREFD that are fixed to the ground voltage Vss in the deep power-down mode must be quickly restored to a prescribed level. In particular, the reference voltage VREFD for the word line voltage VPP, that is, for the boosted external power supply voltage Ext.Vdd, must be produced quickly.

Figure 11:
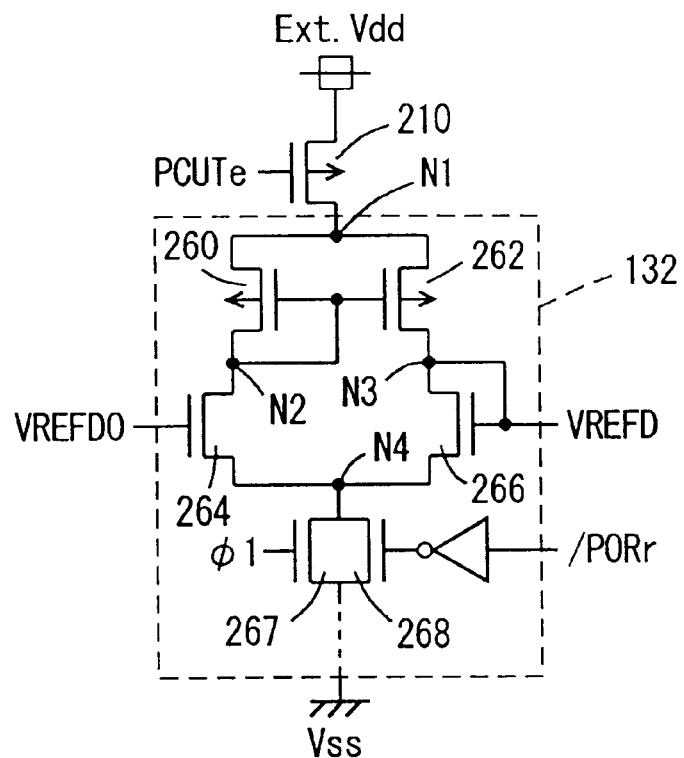
FIG. 11 is a circuit diagram showing the structure of a buffer circuit that is highly responsive upon restoration to the normal mode.

Hereinafter, the structure of the buffer circuit that is highly responsive upon restoration to the normal mode will be described. FIG. 11 exemplarily shows the structure of the buffer circuit 132 corresponding to the word line voltage VPP.

Referring to FIG. 11, the buffer circuit 132 includes PMOS transistors 260, 262 and NMOS transistors 264, 266, 267 that are arranged in the same manner as that of the buffer circuit shown in FIG. 8. However, the buffer circuit 132 is different from the buffer circuit of FIG. 8 in that the buffer circuit 132 additionally includes an NMOS transistor 268 connected in parallel with the NMOS transistor 267.

The NMOS transistor 268 is electrically coupled between a node N4 and the ground voltage Vss, and is turned ON in response to activation (L level) of a power-on reset signal /PORr.

The power-on reset signal /PORr is normally activated for a fixed period upon startup. In the present embodiment, the power-on reset signal /PORr is also activated to L level for a prescribed period upon restoration from the deep power-down mode to the normal mode.

Thus, as compared to the buffer circuit having the structure of FIG. 8, the buffer circuit 132 of FIG. 11 has an increased amount of operating current supplied in the active period of the power-on reset signal /PORr, thereby enabling the reference voltage VREFD to rise quickly from the ground voltage Vss upon restoration to the normal mode.

Figure 12:
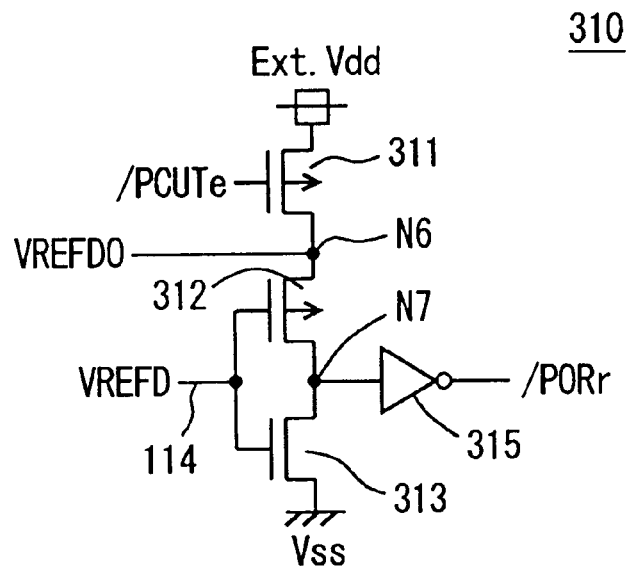
FIG. 12 is a circuit diagram showing the structure of a power-on reset signal generation circuit.

Referring to FIG. 12, a power-on reset signal generation circuit 310 includes a PMOS transistor 311 electrically coupled between the external power supply voltage Ext.Vdd and a node N6, a PMOS transistor 312 electrically coupled between the nodes N6 and N7, an NMOS transistor 313 electrically coupled between the node N7 and the ground voltage Vss, and an inverter 315 for inverting the voltage level at the node N7 to produce the power-on reset signal /PORr.

An inverted power-cut signal /PCUTe is applied to the gate of the PMOS transistor 311. The reference voltage VREFD0 from the reference voltage generation circuit 130 is applied to the node N6. The PMOS transistor 312 and the NMOS transistor 313 have their respective gates coupled to the reference voltage line 114, and form an inverter.

In the deep power-down mode, the PMOS transistor 311 is turned ON, and the reference voltage VREFD is fixed to the ground voltage Vss. As a result, the PMOS transistor 312 is turned ON and the NMOS transistor 313 is turned OFF. The power-on reset signal /PORr is thus activated to L level in preparation for restoration to the normal mode.

When the operation mode is switched from the deep power-down mode to the normal mode, the reference voltages VREFD0 and VREFD from the reference voltage generation circuit 130 start changing to a value corresponding to the target level of the word line voltage VPP in the normal mode. The NMOS transistor 313 is kept in the OFF state for a prescribed period until the reference voltage VREFD exceeds a prescribed value corresponding to the threshold voltage of the NMOS transistor 313. Therefore, the power-on reset signal /PORr is also kept active (L level) for that period.

When the reference voltage VREFD exceeds the prescribed value, the NMOS transistor 313 is turned ON, whereby the power-on reset signal /PORr is inactivated to H level.

Thus, upon restoration to the normal mode, an operating current path of the buffer circuit 132 is assured in response to turning-ON of the PMOS transistor 210, whereby the operating current of the buffer circuit 132 can be supplied through both NMOS transistors 267 and 268. As a result, upon restoration from the deep power-down mode to the normal mode, the reference voltage VREFP rises from the ground voltage Vss more quickly, thereby enabling rapid restoration of the word line voltage VPP.

Note that the structure of the buffer circuit shown in FIG. 11 is applicable to the respective buffer circuits 112 and 122 for the peripheral circuitry power supply voltage VDDP and the memory array power supply voltage VDDS shown in FIG. 6. In this case, the buffer circuits 112, 122 and 132 may share the power-on reset signal generation circuit shown in FIG. 12.

Second Embodiment

In the second embodiment, the structure of the internal power supply circuit for maintaining uniform control response of the internal power supply voltages for different levels of external power supply voltage will be described.

First, the difference in level of the internal power supply voltages depending on the external power supply voltage levels will be described in connection with FIG. 13.

Referring to FIG. 13, two types of external power supply voltages, i.e., 2.5 V level and 2.7 V level, are exemplarily applied in the second embodiment.

In the case where the 2.7 V-level external power supply voltage is applied, the memory array power supply voltage VDDS and the peripheral circuitry power supply voltage VDDP are respectively set to 2.0 V and 2.5 V by down converting the external power supply voltage Ext.Vdd (2.7 V). The word line voltage VPP is set to 3.7 V by boosting the external power supply voltage Ext.Vdd (2.7 V). The substrate voltage VBB is set to a negative voltage, −1 V.

In the case where the 2.5 V-level external power supply voltage is applied, the memory array power supply voltage VDDS, the word line voltage VPP and the substrate voltage VBB are respectively set to 2.0 V, 3.7 V and −1 V as in the case of the 2.7 V-level external power supply voltage.

In the case of the lower external power supply voltage Ext.Vdd, i.e., the 2.5 V-level external power supply voltage, degradation in driving capability of a driver may hinder the control response of the internal power supply voltages. Therefore, the response speed of a comparator and a driver is increased in the circuitry relating to generation of the memory array power supply voltage. For the same reason, the boosting speed need be increased in the circuitry relating to generation of the word line voltage VPP by, e.g., increasing the size of a pump capacitor.

In the case where the 2.5 V-level external power supply voltage is applied, the external power supply voltage Ext.Vdd can be directly used as the peripheral circuitry power supply voltage VDDP (2.5 V). Hereinafter, this is sometimes referred to as "external power supply voltage direct-coupling mode". In the external power supply voltage direct-coupling mode, the internal power supply line 118 for supplying the peripheral circuitry power supply voltage VDDP is directly coupled to the external power supply line and the driver thereof is increased in size in order to improve the current supplying capability.

Hereinafter, the structure of the circuitry relating to generation of the peripheral circuitry power supply voltage VDDP according to the second embodiment will be described. In the circuitry relating generation of the peripheral circuitry power supply voltage VDDP according to the second embodiment, the reference voltage generation circuit 110, the buffer circuit 112 and the internal power supply voltage generation circuit 116 shown in FIG. 6 are replaced with a reference voltage generation circuit 410, a buffer circuit 412 and an internal power supply voltage generation circuit 416.

Figure 14:
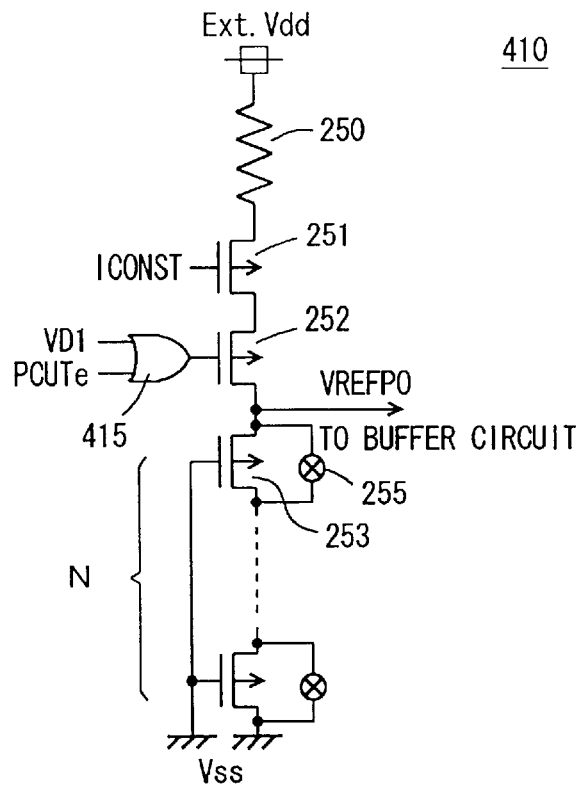
FIG. 14 is a circuit diagram showing the structure of a reference voltage generation circuit corresponding to a peripheral circuitry power supply voltage according to a second embodiment of the present invention.

Referring to FIG. 14, the reference voltage generation circuit 410 of the second embodiment is different from that of the first embodiment shown in FIG. 7 in that the reference voltage generation circuit 410 further includes a logic gate 415.

The logic gate 415 outputs the OR operation result of a power-cut signal PCUTe and a control signal VD1. The output of the logic gate 415 is applied to the gate of the PMOS transistor 252.

The control signal VD1 is set according to the level of the external power supply voltage Ext.Vdd. More specifically, in the case where the external power supply voltage corresponding to the external power supply voltage direct-coupling mode is applied, that is, in the case where the 2.5 V-level external power supply voltage is applied in the example of FIG. 13, the control signal VD1 is set to H level. As described before, when the 2.5 V-level external power supply voltage is applied, the external power supply voltage Ext.Vdd is directly coupled to the internal power supply line 118 so as to produce the peripheral circuitry power supply voltage VDDP. Therefore, generation of the reference voltage VREFP0 is not required.

In the case where an external power supply voltage higher than that of the external power supply voltage direct-coupling mode is applied, that is, in the case where the 2.7 V-level external power supply voltage is applied in the example of FIG. 13, the control signal VD 1 is set to L level.

Thus, the PMOS transistor 252 is turned OFF not only in the deep power-down mode but also in the normal mode depending on the applied external power supply voltage level. Accordingly, in the external power supply voltage direct-coupling mode in which generation of the reference voltage VREFP0 is not required, an operating current of the reference voltage generation circuit 410 is shut off, thereby allowing for reduction in power consumption.

Figure 15:
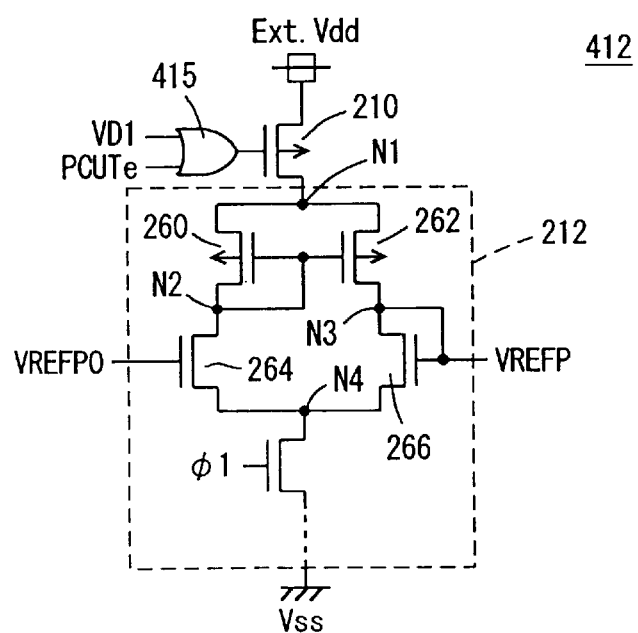
FIG. 15 is a circuit diagram illustrating current supply to a buffer circuit according to the second embodiment.

Referring to FIG. 15, the buffer circuit 412 of the second embodiment is the same as the buffer circuit 112 of FIG. 8 in terms of the structure, but is different in the manner in which an operating current is supplied.

The output of the logic gate 415 is applied to the gate of the PMOS transistor 210 that is electrically coupled between the external power supply voltage Ext.Vdd and the buffer circuit 412. The logic gate 415 is the same as that of FIG. 14. As in the reference voltage generation circuit 410, in the external power supply voltage direct-coupling mode in which generation of the reference voltage VREFP is not required, an operating current of the buffer circuit 412 is shut off, thereby allowing for reduction in power consumption.

Figure 16:
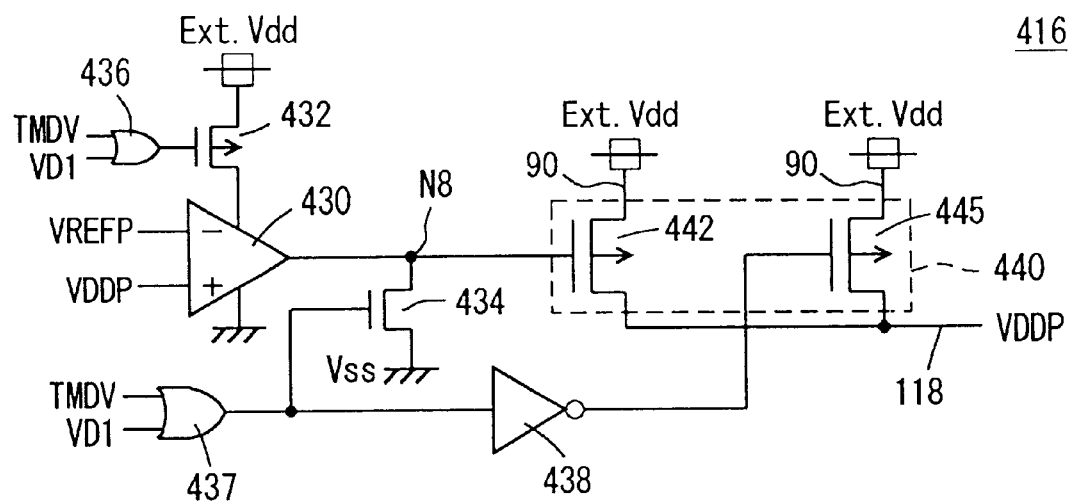
FIG. 16 is a circuit diagram showing the structure of an internal power supply voltage generation circuit according to the second embodiment.

Referring to FIG. 16, the internal power supply voltage generation circuit 416 of the second embodiment includes a comparator 430, a PMOS transistor 432, an NMOS transistor 434, logic gates 436, 437, an inverter 438, and an internal power supply current supplying portion 440. The internal power supply current supplying portion 440 includes driver transistors 442, 445.

The comparator 430 amplifies the voltage difference between the reference voltage VREFP for the peripheral circuitry power supply voltage VDDP and the peripheral circuitry power supply voltage VDDP for output to a node N8. More specifically, the voltage at the node N8 is set to a value closer to H level (external power supply voltage Ext.Vdd) when VDDP>VREFP, and to a value closer to L level (ground voltage Vss) when VDDP<VREFP.

The PMOS transistor 432 is electrically coupled between the external power supply voltage Ext.Vdd and the comparator 430. The NMOS transistor 434 is electrically coupled between the node N8 and the ground voltage Vss.

The logic gate 436 outputs the OR operation result of a control signal VD 1 and a test mode signal TMDV to the gate of the PMOS transistor 432. The test mode signal TMDV is activated to H level when the circuit operation of the external power supply voltage direct-coupling mode is conducted in the operation test.

Like the logic gate 436, the logic gate 437 outputs the OR operation result of the control signal VD 1 and the test mode signal TMDV. The output of the logic gate 437 is applied to the gate of the NMOS transistor 434.

The driver transistor 442 has its gate coupled to the node N8, and is electrically coupled between the external power supply line 90 and the internal power supply line 118. The driver transistor 445 is electrically coupled between the external power supply line 90 and the internal power supply line 118 so as to be in parallel with the driver transistor 442. The driver transistors 442, 445 are each formed from a PMOS transistor. The output of the logic gate 437 inverted by the inverter 438 is applied to the gate of the driver transistor 445.

In this structure, the test mode signal TMDV is set to L level in the normal operation. Therefore, in the case where the 2.7 V-level external power supply voltage that is higher than the external power supply voltage in the external power supply voltage direct-coupling mode is applied (the control signal VD 1 is at L level), the respective outputs of the logic gates 436, 437 are set to L level. Accordingly, the PMOS transistor 432 is turned ON, whereas the NMOS transistor 434 is turned OFF. Moreover, the driver transistor 445 is forcibly turned OFF. Thus, the driver transistor 442 supplies an internal power supply current from the external power supply line 90 to the internal power supply line 118 according to the voltage at the node N8, that is, the voltage comparison result of the comparator 430.

In contrast, in the case where the 2.5 V-level external power supply voltage corresponding to the external power supply voltage direct-coupling mode is applied (the control signal VD1 is at H level), the respective outputs of the logic gates 436, 437 are set to H level. Accordingly, the PMOS transistor 432 is turned OFF, whereas the NMOS transistor 434 is turned ON.

As a result, an operating current of the comparator 430 is shut off, and the node N8 is fixed to the ground voltage Vss. The driver transistors 442, 445 arranged in parallel are both forcibly turned ON to couple the external power supply line 90 to the internal power supply line 118, whereby an internal power supply current is supplied.

Thus, a total of the current supplying capability of the driver transistors 442 and 445 can be assured even in the external power supply voltage direct-coupling mode in which a lower external power supply voltage is applied and the driver transistor has relatively poor current supplying capability.

Accordingly, the same control response of the peripheral circuitry power supply voltage VDDP can be assured.

When the test mode signal TMDV is set to H level in the operation test, the respective outputs of the logic gates 436, 437 are forcibly changed to H level. Therefore, the same circuit operation as that in the external power supply voltage direct-coupling mode in the normal operation can be conducted for testing.

Figure 17:
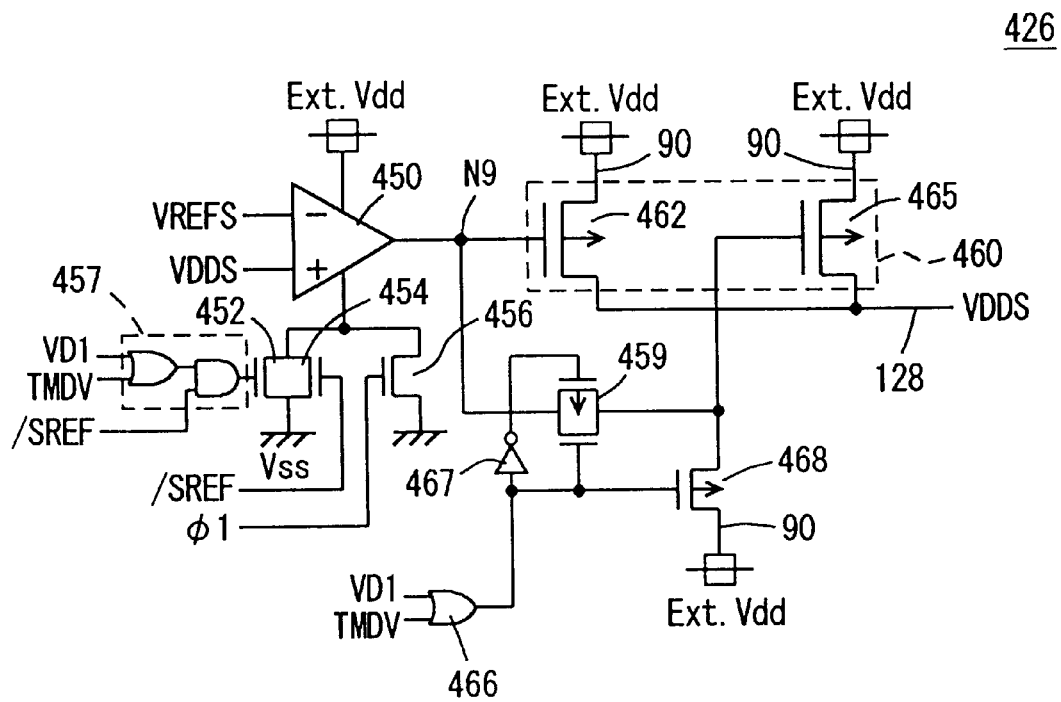
FIG. 17 is a circuit diagram showing the structure of an internal power supply voltage generation circuit according to the second embodiment.

Referring to FIG. 17, an internal power supply voltage generation circuit 426 of the second embodiment includes a comparator 450, NMOS transistors 452, 454, 456 for controlling the operating current amount of the comparator 450, logic circuit 457, a transfer gate 459, an internal power supply current supplying portion 460, logic gate 466, an inverter 467, and a PMOS transistor 468. The internal power supply current supplying portion 460 includes driver transistors 462, 465.

The comparator 450 amplifies the voltage difference between the reference voltage VREFS for the memory array power supply voltage VDDS and the memory array power supply voltage VDDS for output to a node N9. More specifically, the voltage at the node N9 is set to a value closer to H level (external power supply voltage Ext.Vdd) when VDDS>VREFS, and to a value closer to L level (ground voltage Vss) when VDDS<VREFS.

The NMOS transistors 452, 454, 456 are connected in parallel between the comparator 450 and the ground voltage Vss. The output of the logic circuit 457 is applied to the gate of the NMOS transistor 452. The logic gate 457 includes an OR gate for outputting the OR operation result of the control signal VD 1 and the test mode signal TMDV, and an AND gate for outputting the AND operation result of the output of the OR gate and an inverted control signal /SREF. The control signal SREF is set to H level upon execution of the self-refresh command, and is set to L level in the period other than the execution period of the self-refresh command.

In this structure, the gate voltage of the NMOS transistor 452 is forcibly set to L level (ground voltage Vss) upon execution of the self-refresh command. In the period other than the execution period of the self-refresh command, the gate voltage of the NMOS transistor 452 is set to H level (external power supply voltage Ext.Vdd) when the control signal VD1 or the test mode signal TMDV is set to H level, that is, when the 2.5 V-level external power supply voltage corresponding to the external power supply voltage direct-coupling mode is applied, or when a prescribed operation test is designated in the operation test.

The inverted control signal /SREF is applied to the gate of the NMOS transistor 454. As a result, the NMOS transistor 454 is turned OFF upon execution of the self-refresh command, and is turned ON in the period other than the execution period of the self-refresh command. The control voltage 1 is applied to the gate of the NMOS transistor 456. The NMOS transistor 456 thus continuously supplies a fine current to the comparator 450.

Accordingly, during execution of the self-refresh command, an operating current of the comparator 450 is supplied only through the NMOS transistor 456. In the period other than the execution period of the self-refresh command, the operating current of the comparator 450 is supplied through the NMOS transistors 454 and 456 when an external power supply voltage higher than that in the external power supply voltage direct-coupling mode is applied. The operating current of the comparator 450 is supplied through the NMOS transistors 452, 454 and 456 when the external power supply voltage corresponding to the external power supply voltage direct-coupling mode is applied.

With such a structure, the response speed of the comparator 450 in the external power supply voltage direct-coupling mode is improved over the case where an external power supply voltage higher than that in the external power supply voltage direct-coupling mode is applied. Moreover, a reduced operating current of the comparator 450 is supplied during execution of the self-refresh command, allowing for reduction in current consumption. This is because the memory array portion 10 consumes a small amount of current during execution of the self-refresh command and thus the control response required for the memory array power supply voltage VDDS is not strict.

The driver transistors 462, 465 are each formed from a PMOS transistor so as to be connected in parallel between the external power supply line 90 and the internal power supply line 128. The driver transistor 462 has its gate coupled to the node N9. The driver transistor 465 has its gate coupled to the node N9 through the transfer gate 459. The gate of the driver transistor 465 is also electrically coupled to the external power supply voltage Ext.Vdd through the PMOS transistor 468.

The transfer gate 459 is turned ON/OFF in response to the output of the logic gate 466. More specifically, the transfer gate 459 is turned ON in the case where the control signal VD 1 or the test mode signal TMDV is set to H level. The transfer gate 459 is turned OFF in the case where the control signal VD1 and the test mode signal TMDV are both set to L level.

The PMOS transistor 468 is electrically coupled between the external power supply voltage Ext.Vdd and the gate of the driver transistor 465, and receives the output of the logic gate 466 at its gate.

Thus, the PMOS transistor 468 is turned ON as well as the transfer gate 459 is turned OFF in the case where an external power supply voltage higher than that in the external power supply voltage direct-coupling mode is applied. Accordingly, the driver transistor 465 is forcibly turned OFF, whereby an internal power supply current is supplied from the external power supply line 90 to the internal power supply line 128 through the driver transistor 462 according to the voltage at the node N9.

In contrast, in the external power supply voltage direct-coupling mode, the transfer gate 459 is turned ON as well as the PMOS transistor 468 is turned OFF. As a result, the node N9 is coupled to the respective gates of the driver transistors 462 and 465, whereby an internal power supply current can be supplied through the driver transistors 462 and 465 arranged in parallel with the same current supplying capability regardless the level of the external power supply voltage. Accordingly, the control response of the memory array power supply voltage VDDS can be maintained even in the external power supply voltage direct-coupling mode in which the driver transistor has relatively poor current driving capability.

In the operation test, the respective outputs of the logic gates 457 and 466 can be set to H level by setting the test mode signal TMDV to H level. Therefore, the circuit operation in the external power supply voltage direct-coupling mode can be conducted for testing.

In the second embodiment, the voltage booster circuit 136 of FIG. 6 is replaced with a voltage booster circuit 470.

Figure 18:
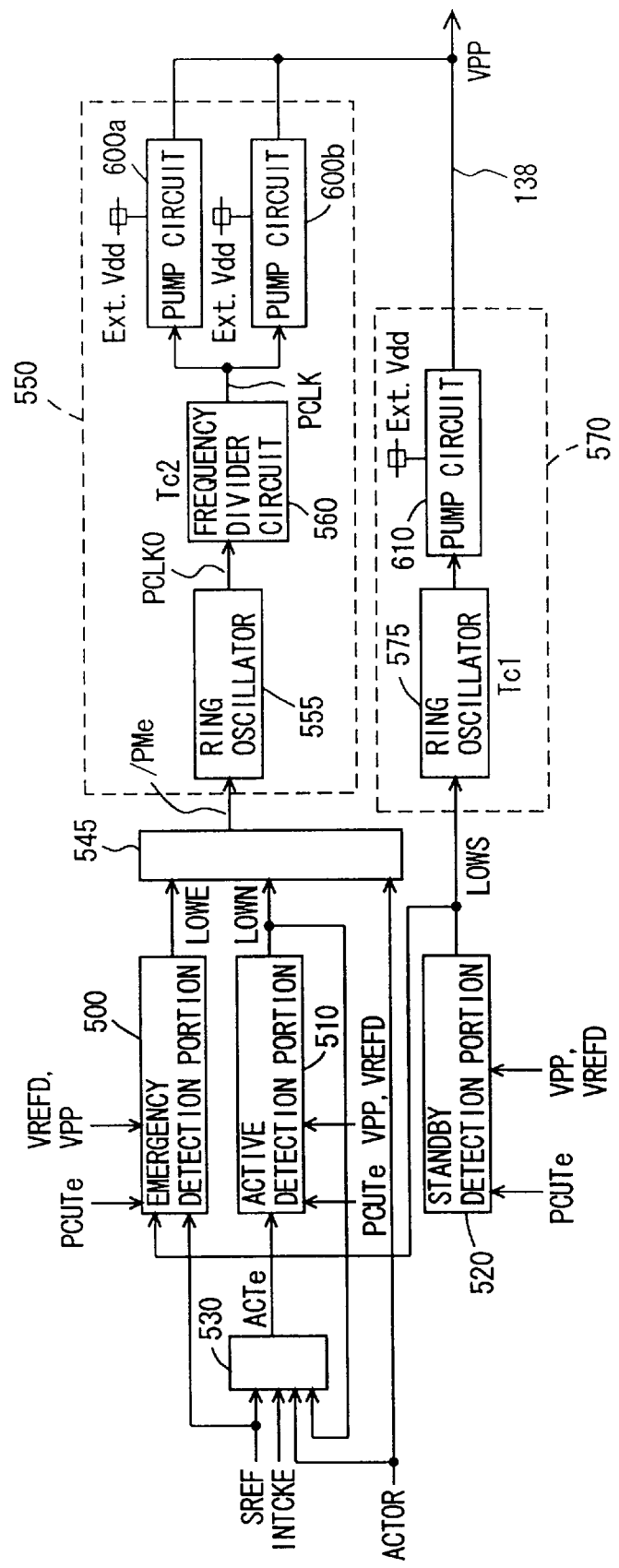
FIG. 18 is a block diagram showing the structure of a voltage booster circuit according to the second embodiment.

Referring to FIG. 18, the voltage booster circuit 136 of the second embodiment includes an emergency detection portion 500, an active detection portion 510, a standby detection portion 520, an active detection portion control circuit 530, a booster unit control circuit 545, an active booster unit 550, and a standby booster unit 570.

The emergency detection portion 500 activates a detection signal LOWE to H level when the word line voltage VPP becomes lower than the corresponding reference voltage VREFD during operation. The active detection portion 510 and the standby detection portion 520 operate in the same manner as that of the emergency detection portion 500. More specifically, the active detection portion 510 activates a detection signal LOWN to H level when the word line voltage VPP becomes lower than the corresponding reference voltage VREFD during the active period. The standby detection portion 520 activates a detection signal LOWS to H level when the word line voltage VPP becomes lower than the corresponding reference voltage VREFD during the standby period.

The standby detection portion 520 operates both in an active period and a standby period continuously. The emergency detection portion 500 operates in response to activation of the detection signal LOWS of the standby detection portion 520 in a period other than the execution period of the self-refresh command. The active detection portion 510 operates in response to activation (i.e., active period) of a detection portion activation signal ACTe.

In the H level period of the internal clock enable signal INTCKE or in the execution period of the self-refresh command, the active detection portion control circuit 530 sets the detection portion activation signal ACTe to the active state (H level) in response to the active period (H level) of a control signal ACTOR or detection signal LOWN.

The booster unit control circuit 545 produces an enable signal /PMe for operating the active booster unit 550, based on the detection signals LOWE and LOWN from the emergency detection portion 500 and the active detection portion 510 and the control signal ACTOR. The active booster unit 550 operates in the active period of the enable signal /PMe.

The booster unit control circuit 545 activates the enable signal /PMe in the active period of the detection signal LOWE. When the detection signal LOWN is activated to H level, the booster unit control circuit 545 activates the enable signal /PMe if the control signal ACTOR or the detection signal LOWE has been activated to H level. In this case, the enable signal /PMe thus activated is kept in the active state until the detection signal LOWN is inactivated (L level).

The active booster unit 550 includes a ring oscillator 555, a frequency divider circuit 560, and pump circuits 600a, 600b. The pump circuits 600a and 600b are arranged in parallel.

The ring oscillator 555 produces an oscillation signal PCLK0 in response to activation of the enable signal /PMe. The frequency divider circuit 560 divides the oscillation signal PCLk0 to produce a pump clock PCLK having a cycle Tc2.

In response to the pump clock PCLK, the pump circuits 600a, 600b boost the external power supply voltage Ext.Vdd by charge pumping operation to output the word line voltage VPP onto the internal power supply line 138.

The standby booster unit 570 includes a ring oscillator 575 and a pump circuit 610. The ring oscillator 575 is rendered in an operating state in response to activation of the detection signal LOWS of the standby detection portion 520, and produces a pump clock having a cycle Tc1 (>Tc2). In response to the pump clock thus produced by the ring oscillator 575, the pump circuit 610 boosts the external power supply voltage Ext.Vdd to produce the word line voltage VPP onto the internal power supply line 138.

The cycle of the pump clock used in the active booster unit 550 is shorter than that of the pump clock used in the standby booster unit 570. A charge pump capacitor in the active booster unit 550 is designed to have a larger capacitance than that of a charge pump capacitor in the standby booster unit 570. The active booster unit 550 is therefore capable of conducting the boosting operation at a high speed, although consuming a relatively large amount of power. The standby booster unit 570 conducts the boosting operation at a relatively low speed, but consumes only a small amount of power.

Hereinafter, the circuit structure of each portion of the voltage booster circuit 470 will be described in detail.

Figure 19:
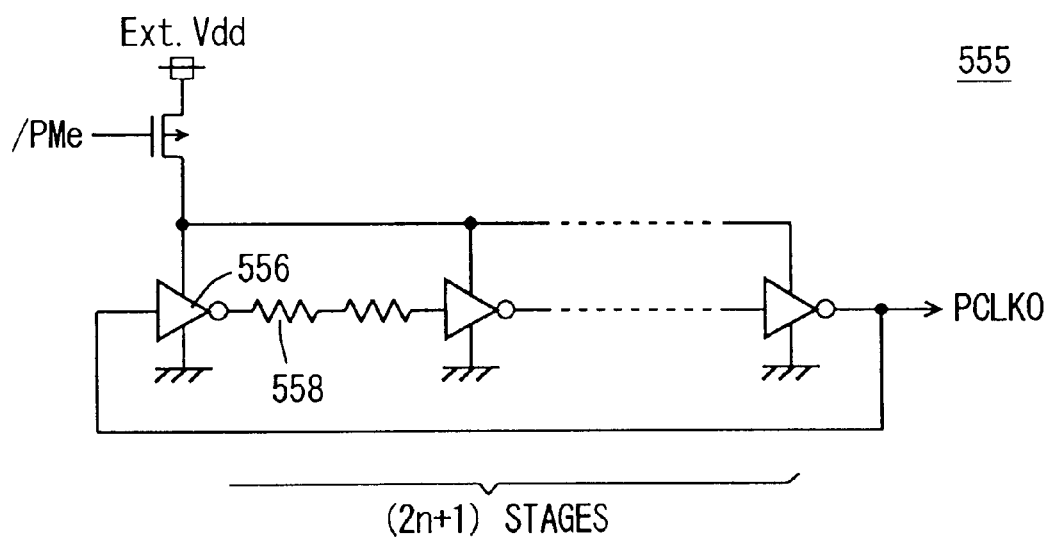
FIG. 19 is a circuit diagram showing the structure of a ring oscillator in FIG. 18.

Referring to FIG. 19, the ring oscillator 555 includes inverters 556 of (2n+1) stages connected in a cyclic manner (where n is a natural number). The external power supply voltage Ext.Vdd is supplied to each inverter 556 in response to activation of the enable signal /PMe. A delay element 558 formed from, e.g., a diffused resistor is provided between adjacent inverters 556.

Such a structure enables suppression of the voltage dependency of the cycle of the oscillation signal PCLK0 by the ring oscillator 555. In other words, even when the external power supply voltage Ext.Vdd of a different level is applied, variation in cycle of the oscillation signal PCLk0 can be suppressed. As a result, disturbance of the control over the internal power supply voltages can be suppressed.

Hereinafter, the structure of the emergency detection portion 500, active detection portion 510 and standby detection portion 520 will be described. Since these detection portions have the same structure, the structure of the emergency detection portion 500 will be exemplarily described in connection with FIG. 20.

Figure 20:
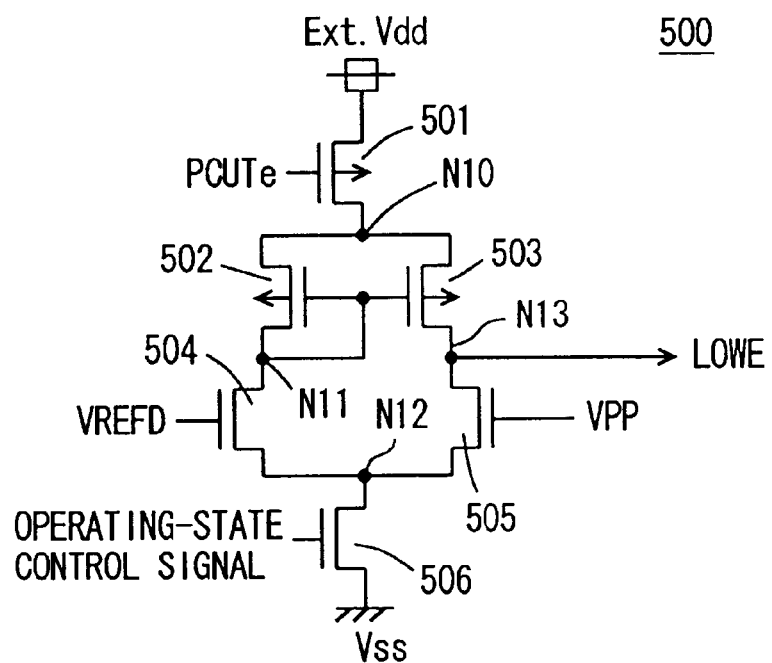
FIG. 20 is a circuit diagram showing the structure of an emergency detection portion in FIG. 18.

Referring to FIG. 20, the emergency detection portion 500 includes PMOS transistors 501 to 503 and NMOS transistors 504 to 506.

The PMOS transistor 501 is electrically coupled between the external power supply voltage Ext.Vdd and a node N10, and receives the power-cut signal PCUTe at its gate. The PMOS transistors 502, 503 are electrically coupled between the node N10 and nodes N11, N13, respectively. The PMOS transistors 502, 503 have their respective gates coupled to the node N11.

The NMOS transistors 504, 505 are electrically coupled between the nodes N11, N13 and a node N12, respectively. The reference voltage VREFD for the word line voltage is applied to the gate of the NMOS transistor 504. The word line voltage VPP is applied to the gate of the NMOS transistor 505. The transistor 506 is electrically coupled between the node N12 and the ground voltage Vss. An operating-state control signal is applied to the gate of the transistor 506.

In the emergency detection portion 500, the operating-state control signal is produced according to the AND operation result of the inverted control signal /SREF and the detection signal LOWS. Accordingly, in a period other than the L-level period of the control signal /SREF, that is, other than the self-refresh period, the NMOS transistor 506 is turned ON in the active period (H level) of the detection signal LOWS, so that an operating current of the emergency detection portion 500 can be supplied.

As described before, generation of the word line voltage VPP is not required in the deep power-down mode. Therefore, the PMOS transistor 501 is cut off in response to the power-cut signal PCUTe. Thus, the operation of the emergency detection portion 500 is discontinued for reduced power consumption.

In response to supply of the operating current, the emergency detection portion 500 amplifies the voltage difference between the word line voltage VPP and the corresponding reference voltage VREFD to output the detection signal LOWE to the node N13. In other words, when the word line voltage VPP becomes lower than the corresponding reference voltage VREFD, the detection signal LOWE is activated to H level.

In the active detection portion 510, the operating-state control signal that is applied to the gate of the NMOS transistor 506 corresponds to the detection portion activation signal ACTe from the active detection portion control circuit 530. In the standby detection portion 520, the operating-state control signal is always set to H level.

The active detection portion 510 and the standby detection portion 520 have otherwise the same circuit structure as that of the emergency detection portion 500. In the deep power-down mode, power consumption is reduced by shutting off the operating current.

Referring back to FIG. 18, the pump circuits 600a and 600b have the same structure, and are capable of switching the boosting operation according to the level of the external power supply voltage Ext.Vdd.

Note that, in the following description, the pump circuits 600a and 600b are sometimes collectively referred to as pump circuit 600.

Figure 21:
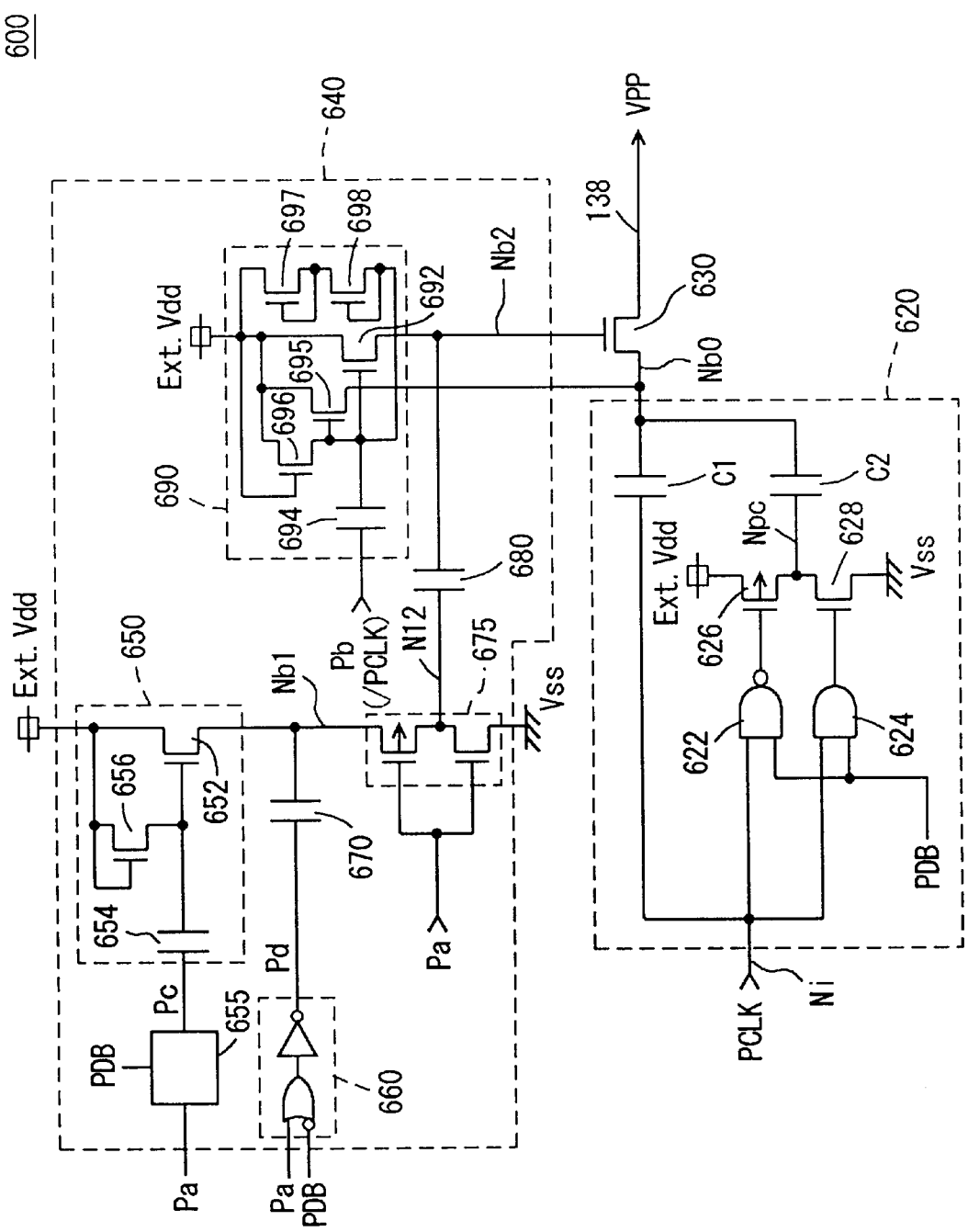
FIG. 21 is a circuit diagram showing the structure of a pump circuit in FIG. 18.

Referring to FIG. 21, the pump circuit 600 includes a boosting portion 620 for receiving a pump clock PCLK (amplitude: Ext.Vdd) and producing a boosted voltage at a node Nb0, a transmission transistor 630 electrically coupled between the node Nb0 and the internal power supply line 138, and a gate boosting portion 640 for boosting the gate voltage of the transistor 630.

The boosting portion 620 includes logic gates 622, 624, a PMOS transistor 626, an NMOS transistor 628, and pump capacitors C1, C2.

The logic gate 622 outputs the NAND operation result of a control signal PDB and the pump dock PCLK. The logic gate 624 outputs the AND operation result of the control signal PDB and the pump clock PCLK. The control signal PDB is activated to H level when the boosting speed is to be increased (hereinafter, sometimes referred to as "in the double-boost mode" and is otherwise (hereinafter, sometimes referred to as "in the single-boost mode") set to L level.

The PMOS transistor 626 is electrically coupled between the external power supply voltage Ext.Vdd and a node Npc. The NMOS transistor 628 is electrically coupled between the node Npc and the ground voltage Vss. The output of the logic gate 622 is applied to the gate of the transistor 626,and the output of the logic gate 624 is applied to the gate of the transistor 628.

The pump capacitor C1 is coupled between a node N1 receiving the pump clock PCLK and the node Nb0. The pump capacitor C2 is coupled between the nodes Npc and Nb0.

In the double-boost mode, the logic gates 622 and 624 output an inverted clock of the pump clock PCLK. As a result, the PMOS transistor 626 and the NMOS transistor 628 operating as an inverter for transmitting the pump clock PCLK are set to the operating state, and output to the node Npc a clock signal that is in phase with the pump clock PCLK. Accordingly, the boosting portion 620 conducts the boosting operation using the parallel-connected pump capacitors C1 and C2. This increases the amount of charges accumulated by a single pumping operation. Accordingly, an increased amount of internal power supply current is supplied to the internal power supply line 138, whereby a relatively high boosting speed can be achieved.

In the single-boost mode, the outputs of the logic gates 622 and 624 are respectively set to H level and L level. Accordingly, the PMOS transistor 626 and the NMOS transistor 628 are both turned OFF, whereby the node Npc is rendered in a high impedance state. In the single-boost mode, the boosting operation is thus conducted using only the pump capacitor C1.

With such a structure, a relatively large amount of internal power supply current is supplied from the pump circuit 600 by the charge pumping operation in the double-boost mode as compared to the case of the single-boost mode.

The transmitting transistor 630 electrically couples the node Nb0 to the internal power supply line 138 according to the voltage at a node Nb2, that is, the gate voltage. In order to transmit to the internal power supply line 138 the charges supplied from the boosting portion 620 to the node Nb0, the voltage at the node Nb2 must be boosted in synchronization with the charge pumping operation of the boosting portion 620.

The gate boosting portion 640 includes a booster unit 650, a sub-clock generation portion 655 for supplying a sub-dock Pc to the booster unit 650, a sub-clock generation portion 660 for supplying a sub-clock Pd, a capacitor 670 electrically coupled between the sub-clock generation portion 660 and a node Nb1, an inverter 675, a capacitor 680 coupled between an output node of the inverter 675 and the node Nb2, and a booster unit 690 provided for the node Nb2.

The booster unit 650 includes an NMOS transistor 652 electrically coupled between the external power supply voltage Ext.Vdd and the node Nb1, a capacitor 654 coupled between the sub-clock generation portion 655 and the gate of the NMOS transistor 652, and an NMOS transistor 656 electrically coupled between the external power supply voltage Ext.Vdd and the gate of the NMOS transistor 652. The external power supply voltage Ext.Vdd is applied to the gate of the NMOS transistor 656.

The sub-clock generation portion 655 generates a sub-clock Pc according to a sub-clock Pa that is produced based on the pump clock PCLK and a control signal PDB. Similarly, the sub-clock generation portion 660 produces a sub-block Pd according to the sub-clock Pa and the control signal PDB.

The inverter 675 electrically couples either the node Nb1 or the ground voltage Vss to a node N12 in response to the sub-clock Pa. The booster unit 690 conducts the boosting operation in response to a sub-clock Pb so as to boost the external power supply voltage Ext.Vdd for transmission to the node Nb2. The sub-clock Pb corresponds to an inverted clock of the pump clock PCLK.

The booster unit 690 includes an NMOS transistor 692 electrically coupled between the external power supply voltage Ext.Vdd and the node Nb2, a capacitor 694 coupled to the gate of the NMOS transistor 692 to receive the sub-clock Pb, an NMOS transistor 695 electrically coupled between the external power supply voltage Ext.Vdd and the node Nb0, and an NMOS transistor 696 electrically coupled between the external power supply voltage Ext.Vdd and the gate of the NMOS transistor 692. The gate of the NMOS transistor 695 is connected to the gate of the NMOS transistor 692. The external power supply voltage Ext.Vdd is applied to the gate of the NMOS transistor 696.

The booster unit 690 further includes NMOS transistors 697 and 698 connected in series between the external power supply voltage Ext.Vdd and the gate of the NMOS transistor 692. Each of the NMOS transistors 697 and 698 is diode-connected. The NMOS transistors 695, 697 and 698 prevent over-boosting of the gate voltage of the NMOS transistor 692.

Hereinafter, the operation of the pump circuit 600 will be described in connection with FIGS. 22A and 22B.

Figure 22A:
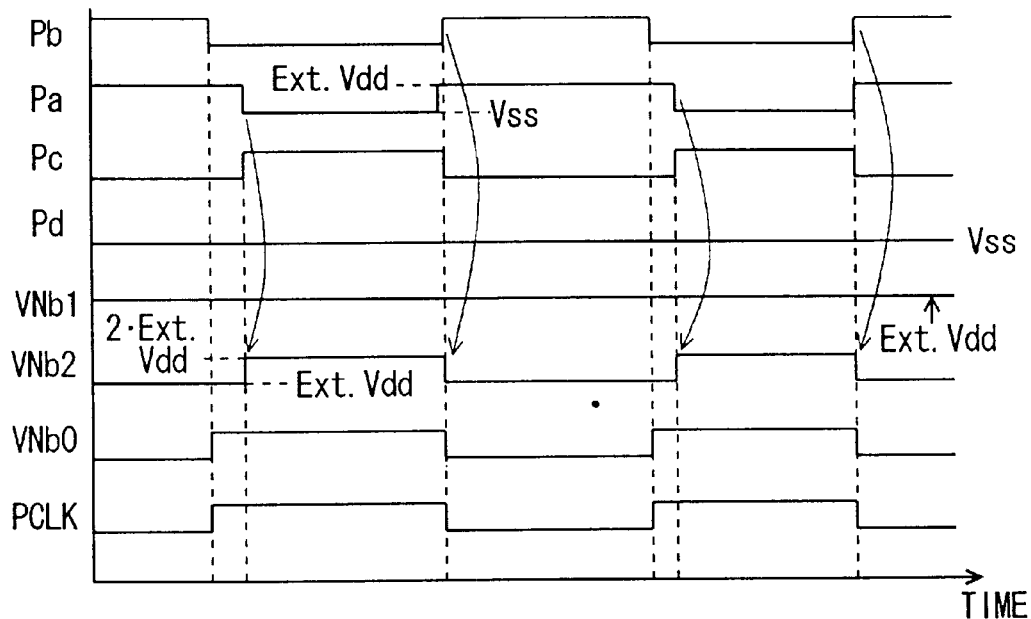
FIGS. 22A and 22B are timing charts illustrating the operation of the pump circuit in FIG. 21.

FIG. 22A shows the operation in the case where the control signal PDB is at L level, that is, in the single-boost mode.

Referring to FIG. 22A, the sub clock Pb corresponds to an inverted clock of the pump clock PCLK. The sub clock Pa has its falling edge delayed with respect to that of the sub clock Pb, but has its rising edge synchronized with that of the sub clock Pb. In the single-boost mode, the sub-clock generation circuit 655 generates the sub-clock Pc as a clock having a polarity inverted with respect to that of the sub clock Pa. The sub-clock Pd is fixed to L level (ground voltage Vss) in the single-boost mode.

Accordingly, in the single-boost mode, a voltage VNb1 at the node Nb1 is fixed to Ext.Vdd. A voltage VNb2 at the node Nb2 is therefore boosted so as to swing between Ext.Vdd and 2·Ext.Vdd in response to the sub clock Pa. Thus, a boosted voltage VNb0 produced at the node Nb0 by the boosting portion 620 is transmitted to the internal power supply line 138 through the transmission transistor 630.

Figure 22B:
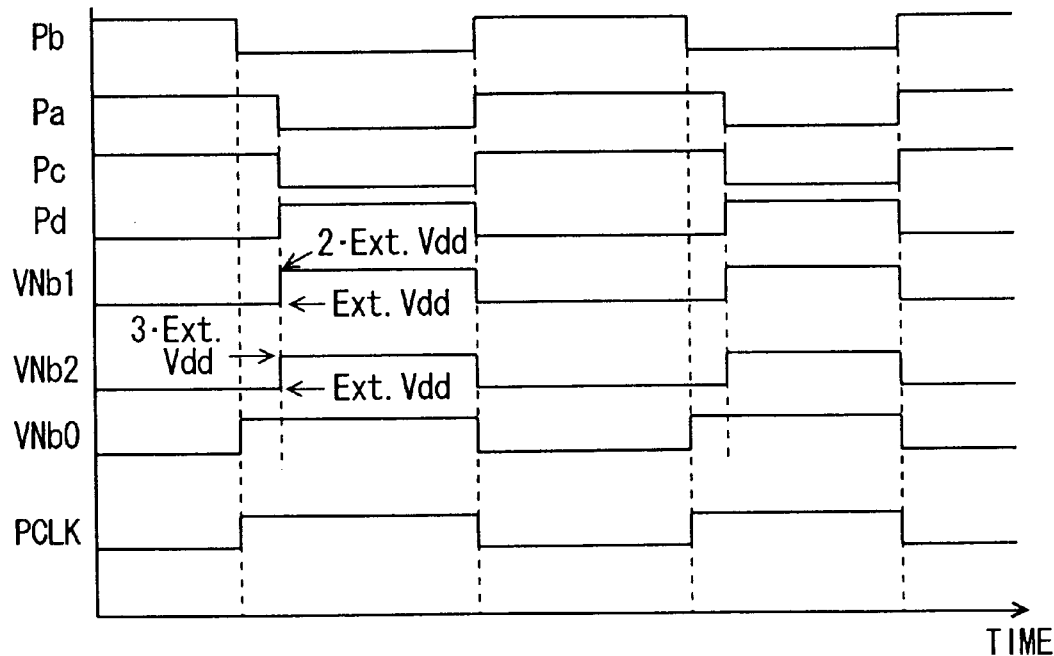

FIG. 22B shows the operation of the pump circuit 600 in the double-boost mode.

Referring to FIG. 22B, in the double-boost mode, the sub-clock generation portion 655 generates a sub-clock Pc as a clock in phase with the sub-clock Pa. In the double-boost mode, the sub-clock generation portion 660 generates a sub-clock Pd as an inverted clock of the sub-clock Pa.

With such a structure, a voltage VNb1 at the node Nb1 is boosted so as to swing between Ext.Vdd and 2·Ext.Vdd. A voltage VNb2 at the node Nb2 is responsively boosted so as to swing between Ext.Vdd and 3·Ext.Vdd. In other words, the gate voltage of the transmission transistor 630 can be boosted by a larger amount in the double-boost mode than in the single-boost mode.

Accordingly, in the double-boost mode, the charges supplied from the boosting portion 620 to the node Nb0 are transmitted to the internal power supply line 138 through the transmission transistor 630, whereby the word line voltage VPP can be boosted at a relatively high speed.

With such a structure, the pump circuit 600 is rendered in the double-boost mode when the external power supply voltage is relatively low (e.g., when the 2.5 V-level external power supply voltage is applied). The pump circuit 600 is rendered in the single-boost mode when the external power supply voltage is relatively high (e.g., when the 2.7 V-level external power supply voltage is applied). Thus, the control response of the word line voltage VPP can be maintained even when a different level of external power supply voltage is applied. More specifically, the control signal PDB need only be set according to the level of external power supply voltage to be applied.

The OR operation result of the control signal PDB and a test control signal that is set to H level in the operation test may be applied instead of the control signal PDB. This enables a circuit operation in the double-boost mode to be conducted for testing.

Referring back to FIG. 18, the pump circuit 610 in the standby booster unit 570 has the same structure as that of the pump circuit 600 of FIG. 21 except that the logic gates 622, 624, the transistors 626, 628 and the pump capacitor C2 are eliminated from the boosting portion 620. The capacitance of the pump capacitor C1 is smaller than that in the pump circuit 600. Since quick response is not required for the pump circuit 610, the pump circuit 610 does not have a function to switch the capacitance of the charge pump capacitor according to the level of the external power supply voltage.

As has been described above, in the second embodiment, the control response of the internal power supply voltages can be maintained to same level by switching the operation of supplying the internal power supply current in the internal power supply circuit according to different levels of external power supply voltages, even when a relatively low external power supply voltage is applied.

Third Embodiment

A plurality of I/O signal levels and a plurality of external power supply voltage levels are applicable to the semiconductor memory device according to the embodiments of the present invention. This enables generalized design of the semiconductor memory devices to which different I/O signal levels and different external power supply voltage levels are applied.

As has been described above, with such generalized design, the level of control signal for switching the operating state of the internal power supply circuit is set to a fixed value according to the operating conditions such as I/O signal level and external power supply voltage level to be applied. In the third embodiment, the structure capable of easily sensing the applied operating conditions from the outside of the semiconductor memory device will be described.

Figure 23:
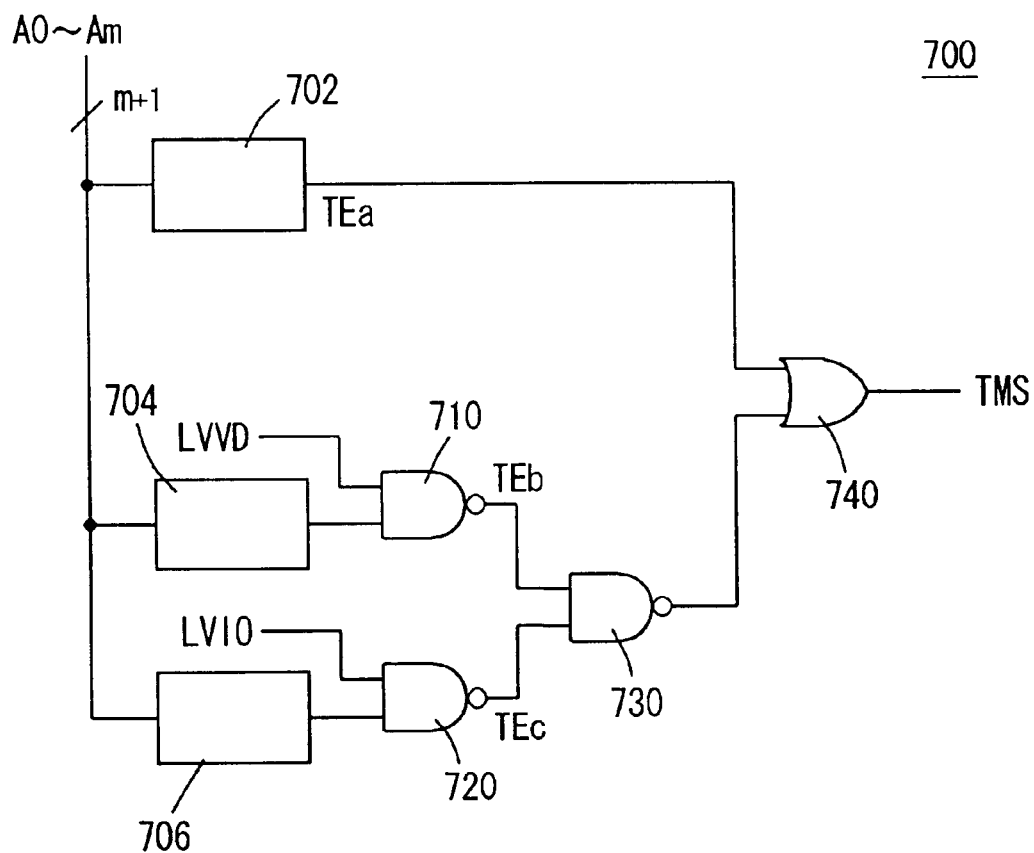
FIG. 23 is a circuit diagram showing the structure of a test mode control circuit according to a third embodiment of the present invention.

Referring to FIG. 23, a test mode control circuit 700 of the third embodiment includes test mode entry circuits 702, 704, 706 for sensing an instruction to conduct a specific operation test in response to a combination of address bits A0 to Am (where m is a natural number) of an address signal.

Each of the test mode entry circuits 702, 704, 706 is a circuit for entering a common operation test. However, the test mode entry circuits 702, 704, 706 sense an instruction to conduct the operation test in response to different combinations of address bits. Each of the test mode entry circuits 702, 704, 706 outputs an H-level signal when an instruction to conduct the operation test is sensed in response to a respective specific combination of address bits A0 to Am. The test mode entry circuit 702 outputs a test entry signal TEa.

The test mode control circuit 700 further includes logic gates 710, 720, 730 and 740. The logic gate 710 outputs the NAND operation result of an output signal of the test mode entry circuit 704 and a control signal LVVD as a test entry signal TEb. For example, the control signal LVVD is set to L level when the external power supply voltage is set to a specific level, and is otherwise set to H level.

The logic gate 720 outputs the NAND operation result of an output signal of the test mode entry circuit 706 and a control signal LVIO as a test entry signal TEc. For example, the control signal LVIO is set to L level when the I/O signal level is set to a specific value, and is otherwise set to H level.

The logic gate 730 outputs the NAND operation result of the test entry signals TEb and TEc. The logic gate 740 outputs the OR operation result of an output signal of the logic gate 730 and the test entry signal TEa as a control signal TMS. The operation test corresponding to the test mode entry circuits 702, 704, 706 is initiated in response to activation of the control signal TMS to H level.

In the case where the control signal LVVD is set to L level, the test entry signal TEb is fixed to H level regardless of the output signal of the test mode entry circuit 704. As a result, even when a specific combination of address bits A0 to Am corresponding to the test mode entry circuit 704 is applied, entry into a corresponding specific operation test is overridden by the logic gate 730. In other words, this operation test cannot be initiated.

In contrast, in the case where the control signal LVVD is set to H level and the combination of address bits A0 to Am corresponding to the test mode entry circuit 704 is applied, the test entry signal TEb falls to L level. Accordingly, the control signal TMS can be activated to H level.

Thus, whether the applied external power supply voltage is at a particular level or not can be determined by checking if the control signal TMS is activated, that is, if a specific operation test can be initiated, when a specific combination of address bits A0 to Am corresponding to the test mode entry circuit 704 is applied.

Similarly, whether the applied I/O signal level is a particular level or not can be determined by checking if the control signal TMS is activated, that is, if a specific operation test can be initiated, when a specific combination of address bits A0 to Am corresponding to the test mode entry circuit 706 is applied.

Even when the control signals LVVD and LVIO are both set to L level, a specific operation test corresponding to the control signal TMS can be initiated by applying a specific combination of address bits A0 to Am corresponding to the test mode entry circuit 702 for activating the test entry signal TEa.

Modification of Third Embodiment

In the modification of the third embodiment, the structure will be described for determining in a simplified manner whether the external power supply voltage corresponding to the external power supply voltage direct-coupling mode as described in the second embodiment has been applied or not.

Figure 24:
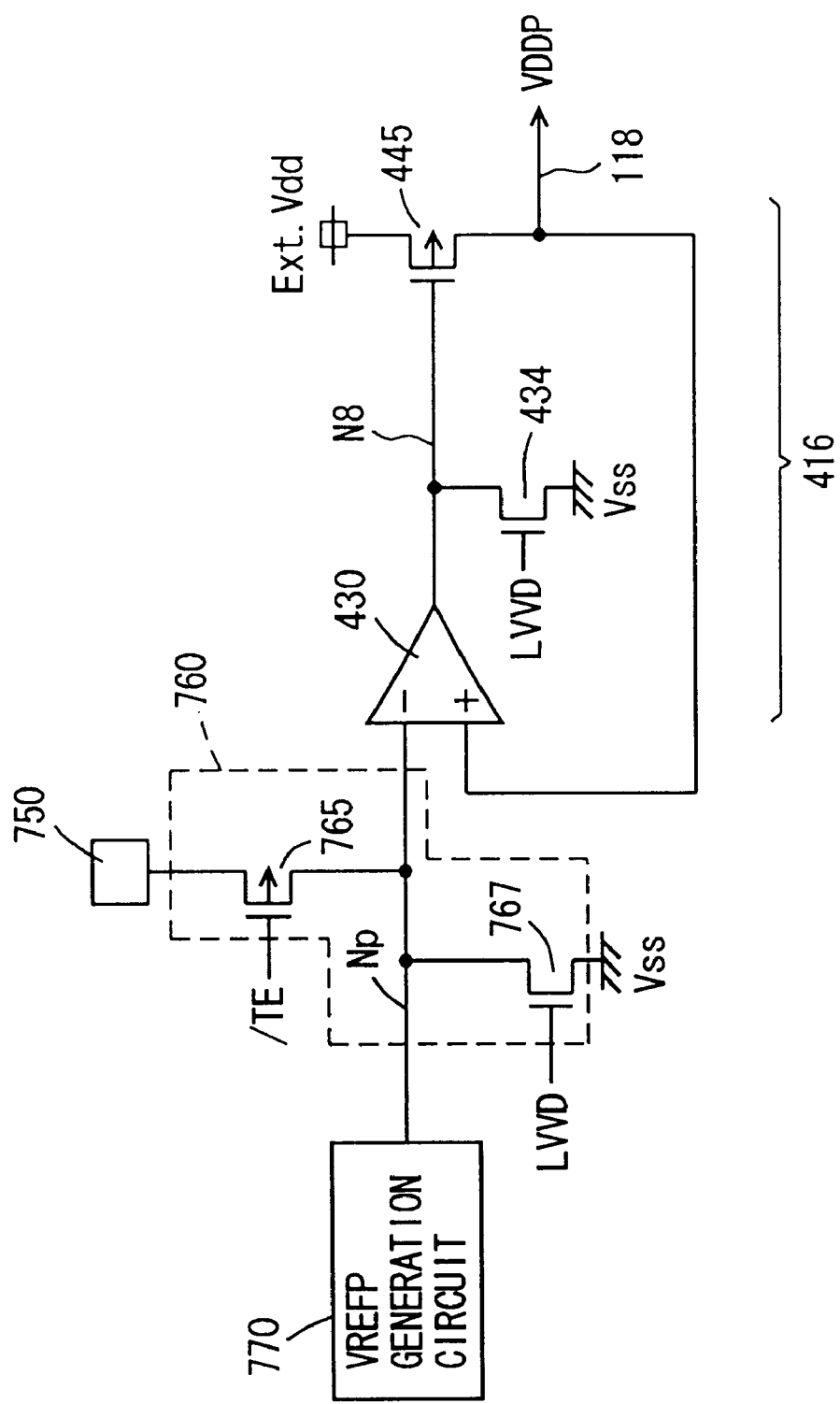
FIG. 24 is a circuit diagram showing the structure of an external power supply voltage level detection circuit according to a modification of the third embodiment.

Referring to FIG. 24, an external power supply voltage level detection circuit 760 according to the modification of the third embodiment includes a transistor switch 765 for electrically coupling an external pad 750 to a node Np in the operation test, and a transistor switch 767 electrically coupled between the node Np and the ground voltage Vss.

The transistor switch 765 is formed from a PMOS transistor receiving a test control signal /TE at its gate. The test control signal /TE is activated to L level upon execution of the operation test in which the reference voltage VREFP is directly applied from the external pad 750 in order to verify the operation of the internal power supply voltage circuit 116.

Regarding the internal power supply voltage generation circuit 416, only a part of the structure of FIG. 16 is shown in FIG. 24. The internal power supply voltage generation circuit 416 receives an external power supply voltage Ext.Vdd and produces a peripheral circuitry power supply voltage VDDP. As described above, in the external power supply voltage direct-coupling mode, the control signal LVVD is set to H level. Therefore, the external power supply voltage Ext.Vdd is directly coupled to the internal power supply line 118 through the driver transistor 445. In other words, the peripheral circuitry power supply voltage VDDP is set to the same voltage level as that of the external power supply voltage Ext.Vdd without requiring the comparator 430 to conduct voltage comparison.

A VREFP generation circuit 770 collectively indicates the reference voltage generation circuit 410 and the buffer circuit 412 for the peripheral circuitry power supply voltage VDDP shown in FIGS. 14 and 15, respectively. In other words, in the external power supply voltage direct-coupling mode in which the control signal LVVD is set to H level, an operating current of the VREFP generation circuit is shut off, so that generation of the reference voltage VREFP to the node Np is discontinued.

If the control signal LVVD has been set to H level when the test control signal /TE is activated to L level, that is, if the external power supply voltage direct-coupling mode has been applied, a leak current is produced at the external pad 750. Accordingly, detecting the leak current at the external pad 750 facilitates determination of whether the applied level of the external power supply voltage corresponds to the external power supply voltage direct-coupling mode or not.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A semiconductor memory device having a normal mode and a low power consumption mode, comprising:
   an internal circuit for conducting a data read operation, a data write operation and a data hold operation;
   a first external power supply line receiving a first external power supply voltage;
   a second external power supply line receiving a second external power supply voltage that is lower than said first external power supply voltage;
   an internal power supply line for transmitting an internal power supply voltage to said internal circuit; and
   an internal power supply circuit for receiving said first and second external power supply voltages and producing said internal power supply voltage, the internal power supply circuit including
      a reference voltage generation portion for receiving said first and second external power supply voltages and generating a reference voltage corresponding to a target level of said internal power supply voltage,
      a first current shut-off switch for shutting off an operating current of said reference voltage generation portion in said low power consumption mode,
      an internal power supply voltage generation portion for keeping said internal power supply voltage at said target level according to comparison between said internal power supply voltage and said reference voltage in said normal mode, and discontinuing its operation in said low power consumption mode, and
      a connection switch for electrically coupling one of said first and second external power supply lines to said internal power supply line in said low power consumption mode.

2. The semiconductor memory device according to claim 1, further comprising a mode register for retaining a mode setting that is externally applied with a first command, wherein
   said mode setting includes designation of whether transition from said normal mode to said low power consumption mode is conducted or not, and
   when said transition is designated in said mode setting, said low power consumption mode is started in response to a second command.

3. The semiconductor memory device according to claim 2, wherein
   said internal circuit includes
      a plurality of memory cells arranged in a matrix,
      a plurality of word lines provided respectively corresponding to memory cell rows and being selectively activated, and
      a plurality of bit lines provided respectively corresponding to memory cell columns and being respectively coupled to the memory cells corresponding to an activated word line,
   said second command is a refresh command for conducting said data hold operation, and
   after said refresh command is started, said low power consumption mode is started with each of said word lines being inactivated.

4. The semiconductor memory device according to claim 2, further comprising a control circuit for instructing restoration to said normal mode according to change of an external control signal from a first level to a second level in said low power consumption mode, said external control signal being set to said first level before input of said second command.

5. The semiconductor memory device according to claim 4, wherein said first level corresponds to one of said first and second external power supply voltages, and said second level corresponds to the other, said semiconductor memory device further comprising:
   an internal control signal generation circuit for receiving said external control signal and generating an internal control signal, said internal control signal generation circuit including
      a first buffer operating in said low power consumption mode and driven with said first external power supply voltage, a second buffer operating in said normal mode, for receiving said external control signal driven with said internal power supply voltage, and a logic circuit for setting said internal control signal to either said internal power supply voltage or said second external power supply voltage according to said external control signal received by one of said first and second buffers that is in operation, and said control circuit instructs said restoration in response to said internal control signal.

6. The semiconductor memory device according to claim 1, wherein said internal power supply circuit further includes a buffer portion provided between said reference voltage generation portion and said internal power supply voltage generation portion, for transmitting said reference voltage from said reference voltage generation portion to said internal power supply voltage generation portion, and a second current shut-off switch for shutting off an operating current of said buffer portion in said low power consumption mode.

7. The semiconductor memory device according to claim 6, wherein said buffer portion includes an operating current control portion for controlling an operating current amount, and said operating current control portion sets said operating current amount in a transition period from said low power consumption mode to said normal mode to a larger value than that in said normal mode.

8. A semiconductor memory device capable of switching a level of an external power supply voltage, comprising:

an internal circuit for conducting a data read operation, a data write operation and a data hold operation;

an external power supply line receiving said external power supply voltage;

an internal power supply line for transmitting an internal power supply voltage to said internal circuit; and an internal power supply circuit for receiving said external power supply voltage and supplying an internal power supply current to said internal power supply line so as to keep said internal power supply voltage at a target level, wherein the operation of supplying said internal power supply current in said internal power supply circuit is switched according to the level of said external power supply voltage in order to maintain the same control response of said internal power supply voltage regardless of the level of said external power supply voltage.

9. The semiconductor memory device according to claim 8, wherein said internal power supply circuit includes a reference voltage generation portion for receiving said external power supply voltage and generating a reference voltage corresponding to said target level, a voltage comparison portion for producing a voltage at an internal node according to a comparison result between said reference voltage and said internal power supply voltage, and an internal power supply current supplying portion provided between said external power supply line and said internal power supply line, for supplying said internal power supply current to said internal power supply line with the same current supplying capability regardless of the level of said external power supply voltage, and when the level of said external power supply voltage is higher than said target level, said internal power supply current supplying portion supplies said internal power supply current according to the voltage at said internal node, and in an external power supply voltage direct-coupling mode in which the level of said external power supply voltage corresponds to said target level, said internal power supply current supplying portion electrically couples said external power supply line to said internal power supply line so as to supply said internal power supply current.

10. The semiconductor memory device according to claim 8, wherein said internal power supply circuit includes a reference voltage generation portion for receiving said external power supply voltage and generating a reference voltage corresponding to said target level, a voltage comparison portion for producing a voltage at an internal node according to a comparison result between said reference voltage and said internal power supply voltage, a current shut-off switch for shutting off an operating current of said voltage comparison portion when the level of said external power supply voltage corresponds to said target level, a driver transistor provided between said external power supply line and said internal power supply line, for supplying a current corresponding to the voltage at said internal node to said internal power supply line as said internal power supply current, and a connection switch turned ON in an external power supply voltage direct-coupling mode in which the level of said external power supply voltage corresponds to said target level, for electrically coupling a voltage for turning ON said driver transistor to said internal node.

11. The semiconductor memory device according to claim 8, wherein said internal power supply circuit includes a voltage comparison portion for producing a voltage at a first internal node according to a comparison result between a reference voltage corresponding to said target level and said internal power supply voltage, and an internal power supply current supplying portion provided between said external power supply line and said internal power supply line, for supplying said internal power supply current to said internal power supply line according to the voltage at said first internal node, wherein said internal power supply current supplying portion supplies said internal power supply current with the same current supplying capability regardless of the level of said external power supply voltage.

12. The semiconductor memory device according to claim 8, wherein said internal power supply circuit includes a voltage comparison portion for producing a voltage at a first internal node according to a comparison result between a reference voltage corresponding to said target level and said internal power supply voltage, a driver transistor provided between said external power supply line and said internal power supply line, for supplying a current corresponding to the voltage at said first internal node to said internal power supply line as said internal power supply current, and a first operating current control portion for switching an operating current amount to be supplied to said voltage comparison portion according to the level of said external power supply voltage.

13. The semiconductor memory device according to claim 8, wherein
said internal power supply voltage is higher than said external power supply voltage in a normal mode, and
said internal power supply voltage includes
a first detection portion operating both in an active period and a standby period, for sensing reduction in said internal power supply voltage to a level lower than said target level,
a second detection portion operating in said active period, for sensing reduction in said internal power supply voltage to a level lower than said target level,
a third detection portion operating in response to a sensing result of said first detection portion in a period other than during execution of a self-refresh command for said internal circuit, for sensing reduction in said internal power supply voltage to a level lower than said target level,
a first booster unit operating in response to respective sensing results of said second and third detection portions, for boosting said external power supply voltage so as to supply said internal power supply current, and
a second booster unit operating in response to the sensing result of said first detection portion, for boosting said external power supply voltage so as to supply said internal power supply current,
said second booster unit being capable of supplying a larger amount of internal power supply current per unit time than said first booster unit.

14. The semiconductor memory device according to claim 13, wherein
said first booster unit includes
an oscillation portion for generating a pump clock having a predetermined cycle in response to the respective sensing results of said second and third detection portions,
a pumping portion for setting a voltage at a first node to a value higher than said external power supply voltage in response to said pump clock,
a transmission transistor electrically coupled between said first node and said internal power supply line, and
a gate boosting portion for setting a gate voltage of said transmission transistor to a value higher than said external power supply voltage in response to said pump clock, and
said pumping portion includes
a first pump capacitor coupled between a second node receiving said pump clock and said first node,
a clock transmission circuit rendered in an operating state according to the level of said external power supply voltage, for transmitting said pump clock to a third node, and
a second pump capacitor coupled between said first node and said third node.

15. The semiconductor memory device according to claim 14, wherein said clock transmission circuit is forcibly set to said operating state in response to a signal applied in a test mode.

16. The semiconductor memory device according to claim 13, wherein
said first booster unit includes
a first oscillation portion for generating a first pump clock having a first cycle in response to the respective sensing results of said second and third detection portions,
a first pumping portion for setting a voltage at a first node to a value higher than said external power supply voltage in response to said first pump clock,
a first transmission transistor electrically coupled between said first node and said internal power supply line, and
a first gate boosting portion for setting a gate voltage of said first transmission transistor to a value higher than said external power supply voltage in response to said first pump clock,
said second booster unit includes
a second oscillation portion for generating a second pump clock having a second cycle longer than said first cycle in response to the sensing result of said first detection portion,
a second pumping portion for setting a voltage at a fourth node to a value higher than said external power supply voltage in response to said second pump clock,
a second transmission transistor electrically coupled between said fourth node and said internal power supply line, and
a second gate boosting portion for setting a gate voltage of said second transmission transistor to a value higher than said external power supply voltage in response to said second pump clock, and
said first and second gate boosting portions switch a boosting amount from said external power supply voltage according to the level of said external power supply voltage.

17. The semiconductor memory device according to claim 13, wherein
said first booster unit includes
an oscillation portion for generating a pump clock having a predetermined cycle in response to the sensing results of said second and third detection portions and
a pumping circuit for supplying said internal power supply current by charge pumping operation with said pump clock,
said oscillation portion includes an odd number of inverters coupled in a cyclic manner, and a delay element coupled between said inverters.

18. The semiconductor memory device according to claim 13, wherein said internal power supply circuit includes a connection switch for electrically coupling said external power supply line to said internal power supply line in a low power consumption mode, and a current shut-off switch for shutting off an operating current of said first, second and third detection portions in said low power consumption mode.

* * * * *